United States Patent [19]
Thrasher et al.

[11] Patent Number: 5,727,332
[45] Date of Patent: Mar. 17, 1998

[54] CONTAMINATION CONTROL IN SUBSTRATE PROCESSING SYSTEM

[75] Inventors: David L. Thrasher, Santa Clara; John S. Hearne, Los Altos; Lynn S. Ryle, San Jose, all of Calif.

[73] Assignee: Ontrak Systems, Inc., San Jose, Calif.

[21] Appl. No.: 782,155

[22] Filed: Jan. 13, 1997

Related U.S. Application Data

[63] Continuation of Ser. No. 276,047, Jul. 15, 1994, abandoned.

[51] Int. Cl.⁶ .................................................. F26B 3/34
[52] U.S. Cl. .................................. 34/277; 34/61; 34/278
[58] Field of Search ............................ 34/60, 61, 380, 34/266, 275, 276, 277, 278; 437/946, 247; 148/DIG. 17

[56] References Cited

U.S. PATENT DOCUMENTS

| | | | |
|---|---|---|---|
| 3,303,067 | 2/1967 | Haering et al. | 437/247 X |
| 3,970,471 | 7/1976 | Bankes et al. | 134/6 |
| 3,974,002 | 8/1976 | Casey et al. | 437/946 X |
| 5,089,441 | 2/1992 | Moslehi | 437/247 X |
| 5,147,466 | 9/1992 | Ohmori et al. | 134/7 |
| 5,167,079 | 12/1992 | Bowen | 34/60 |
| 5,188,136 | 2/1993 | Kumaeai | 134/902 X |
| 5,288,526 | 2/1994 | Hogan et al. | 34/275 X |
| 5,299,584 | 4/1994 | Miyazaki et al. | 134/902 X |
| 5,327,921 | 7/1994 | Moicuo et al. | 134/902 X |
| 5,329,732 | 7/1994 | Karlsrud et al. | 51/131 J |
| 5,343,629 | 9/1994 | Rae | 34/60 X |

FOREIGN PATENT DOCUMENTS

| | | | |
|---|---|---|---|
| 4323824 | 11/1992 | Japan | 134/902 |
| 2095704 | 10/1982 | United Kingdom | 148/DIG. 17 |

*Primary Examiner*—Hoang Nguyen
*Attorney, Agent, or Firm*—Blakely, Sokoloff, Taylor & Zafman LLP

[57] ABSTRACT

An improved substrate processing system. The system may be used for double sided scrubbing of a semiconductor substrate. The wet stations of the system has covers which prevent accumulated liquid from dripping outside of the station and which minimize dripping on the substrates. Transport tunnels are provided between modules to prevent leakage between the modules. A substrate transport mechanism which is moveable along a rail is provided with the stabilizer to provide for stable substrate transfer. The processing system has two brush stations which are placed within a single enclosure. The sensors located throughout the system, which sense the presence of a wafer, are fixedly mounted in a frame so that they are self-aligned to one another. In the sender station, two sensors are used, with the system requiring both sensors to sense the presence of a wafer to increase the reliability. In the dry station, the heating lamp is shielded from the substrate to reduce particulate contamination. Various flow meters are mounted on a transparent panel to provide easy and convenient hook-up. The system is provided with an airflow control bulkhead between the clean and dirty side of the system to prevent intermixing to thereby provide for lower contamination levels in the clean side of the system.

17 Claims, 17 Drawing Sheets

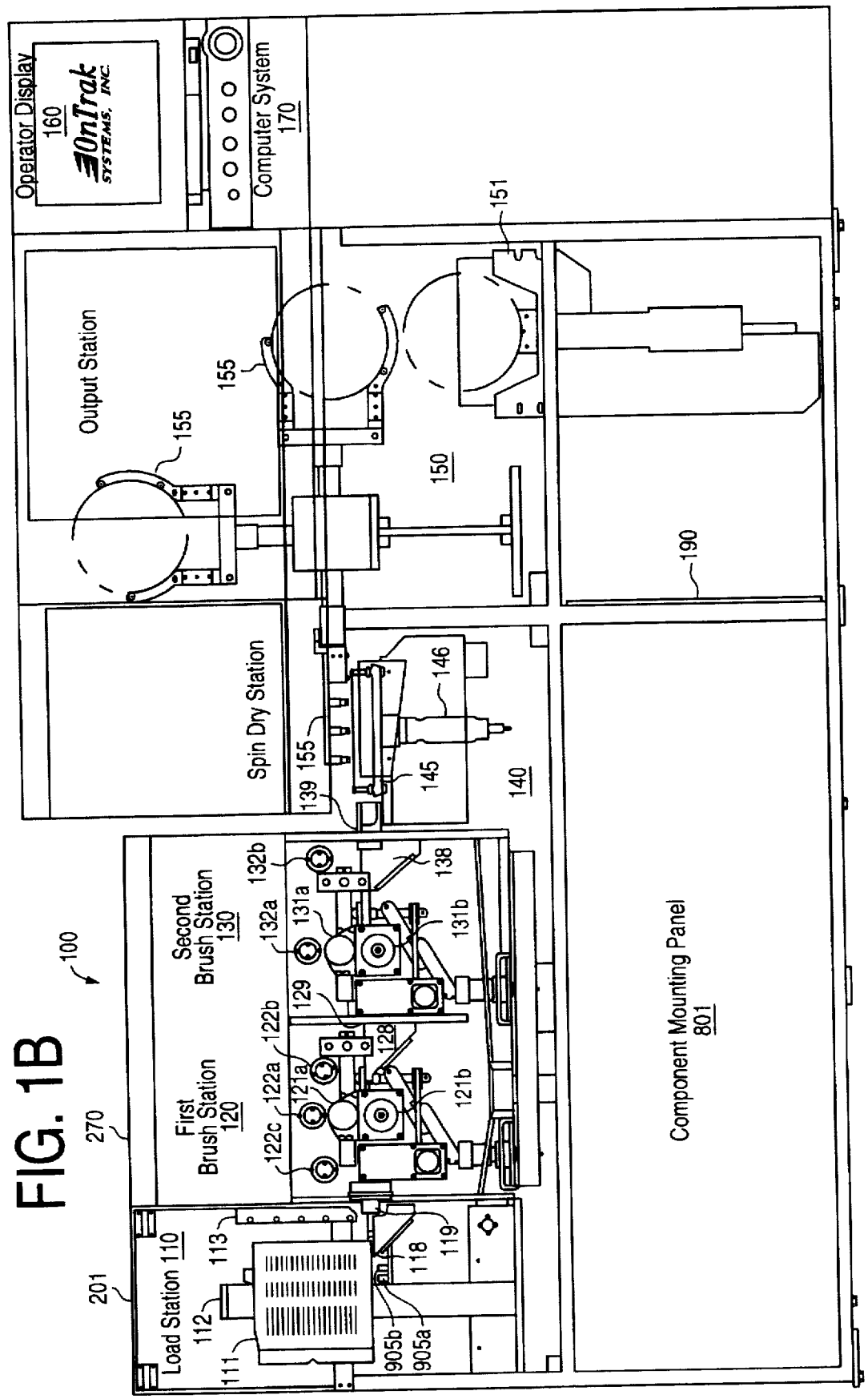

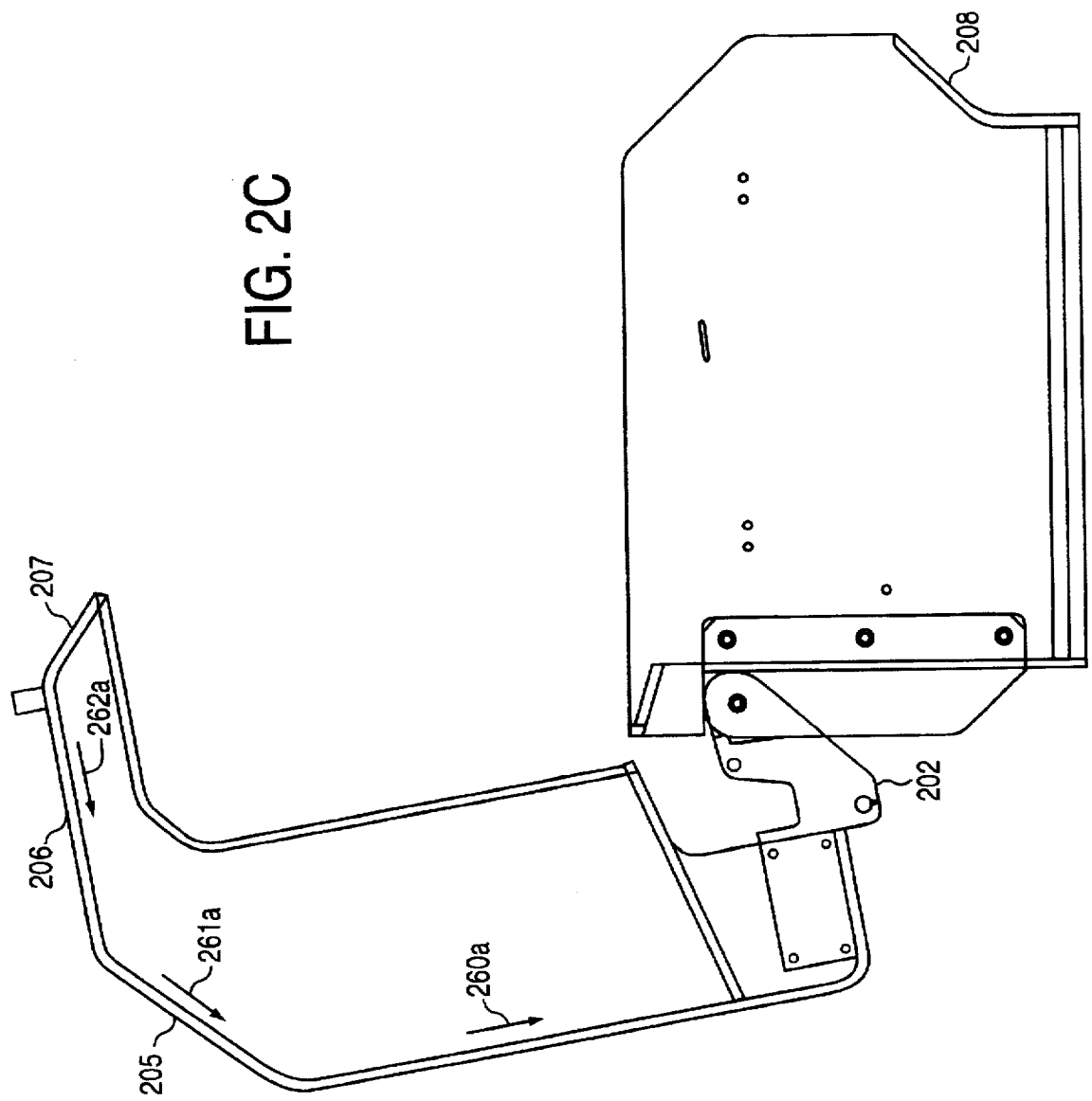

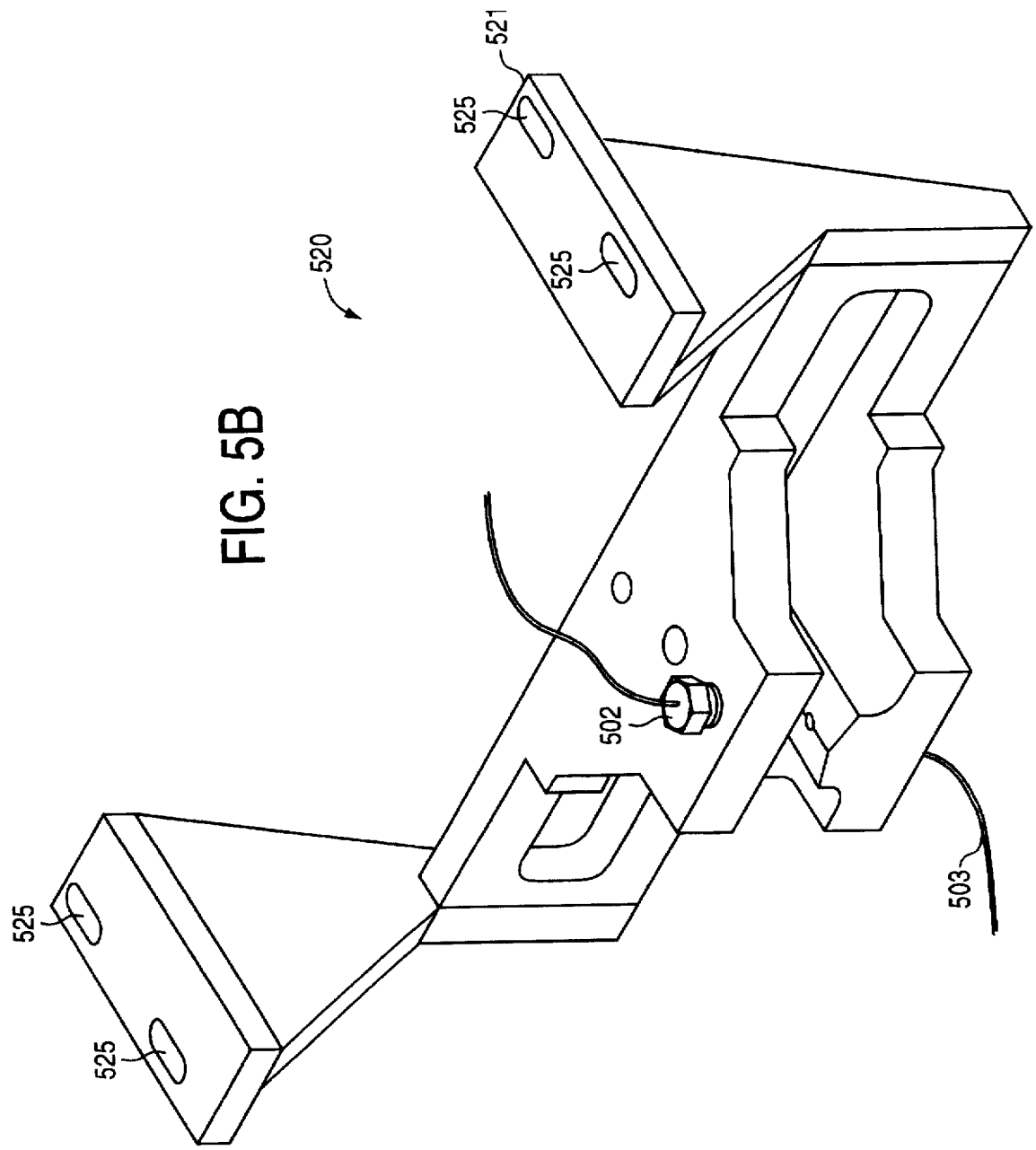

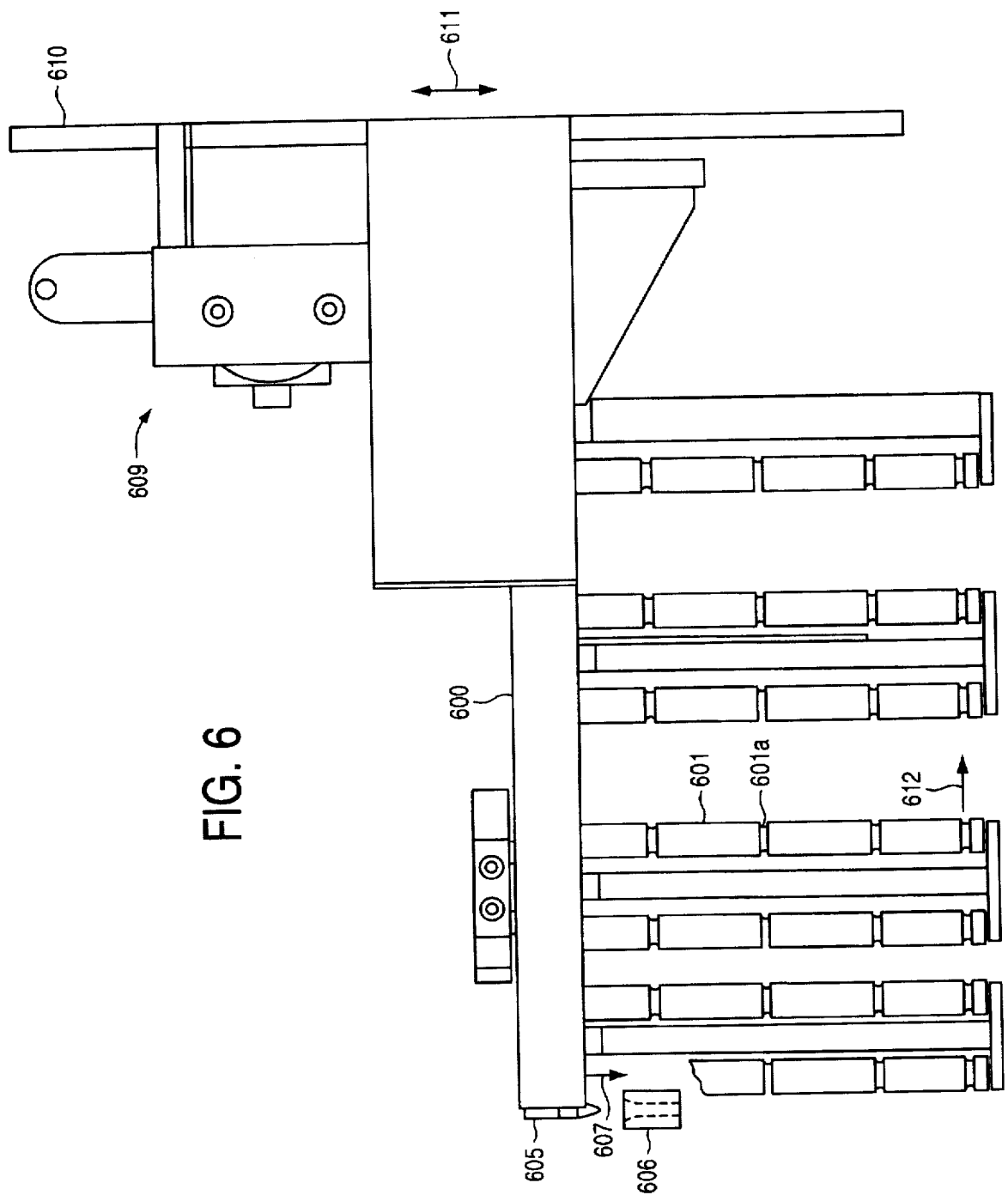

CONTAMINATION CONTROL IN SUBSTRATE PROCESSING SYSTEM

This is a continuation of application Ser. No. 08/276,047, filed Jul. 15, 1994, now abandoned.

BACKGROUND OF THE INVENTION

1. Field of the Invention

The present invention relates to methods and apparatuses for processing a substrate, for example, wet processing of a semiconductor wafer in, for example, a scrubber, wherein both sides of a wafer are scrubbed.

2. Background Information

In the fabrication of semiconductor devices, numerous wet clean steps are performed on a substrate such as a semiconductor wafer at various stages throughout the process. In some cases these wet clean steps may comprise scrubbing the wafer with a brush, and may comprise one or more spin rinses wherein the wafer is sprayed with one or more cleaning solutions and/or water while the wafer is spinning. In many cases, only the front side of the wafer upon which devices are to be formed is cleaned. In many other instances, it is desirable to clean both sides of a wafer. For example, semiconductor substrate manufacturers typically scrub both sides at the completion of the slice manufacturing process. Additionally, other processes may require both sides of a wafer to be scrubbed. For example, chemical mechanical polishing (CMP), is carried out in a slurry, which is an extremely dirty environment by semiconductor fabrication standards. Therefore, both sides of the wafer must be scrubbed after the CMP operation to remove all contamination prior to subsequent processing. Finally, scrubbing, wherein both sides of a wafer are scrubbed, may be used in any application where it is desired to keep the back side (as well as the front side) of the wafer clean, for example, to reduce contaminants introduced into equipment and/or the process from the back side of the wafer.

A wet processing system such as a scrubber, wherein both sides of a wafer are scrubbed comprises several distinct stations or modules. Each module is typically enclosed in a box-like structure which comprises the appropriate processing apparatus for that station. For example, a scrubber, wherein both sides of a wafer are scrubbed may comprise a load or send station, one or more scrub stations, a spin rinse and spin dry station, and an output station. The load or send station typically comprises a platform for holding the cassette, an elevator for lowering and raising the cassette, and a sensor for sensing the presence of a wafer. Additionally, the load station may comprise sprayers to spray the wafers with filtered, deionized water (D.I. water) to keep them wet while they are awaiting processing. This is necessary where the previous operation, such as chemical mechanical polishing, leaves wet contamination (e.g., the slurry mixture) on the wafers, which, if dried, would be virtually impossible to remove. The scrub station typically comprises one or more brushes, wheels which grip and turn the wafer by its side during scrubbing, and sprayers or nozzles for dispensing chemicals. The spin station typically comprises a nozzle for a final water rinse, a spinner for spin drying, and a lamp to provide heat assisted drying. The spin station may also comprise a nitrogen blow off in addition to or in place of the heat lamp to assist drying. Finally, an output station comprises a platform for holding the cassette of cleaned and dried wafers. Additionally, one or more types of wafer transport mechanism, such as rollers, belt conveyors, robotic arms, etc., are provided within and between the stations to transport wafers within and between the stations. The system also comprises numerous sensors to detect the presence of a wafer, and to determine the location of the flat of the wafer, if desired. Often, the portion of the system up to and including the final scrub station is considered the "dirty" side of the system, while the portion after the cleaning stations, including the output station is considered the "clean" side of the system because the wafer has already been processed through a first and a second scrub operation. During the spin rinse and spin dry, the wafer is typically lowered into a cup-shaped structure having a vacuum pulled from the bottom, so that liquid spun off is not directed upward but rather is directed outward and downward. To maintain cleanliness, the top of the dry station is typically open to the fabrication area's overhead laminar flow, or may have its own laminar flow unit to maintain the cleanliness of the wafers. Typically, each module has one or more openings in the bottom portion to allow for connections to the appropriate facilities.

While systems have been developed to perform various wet processing operations such as the scrubbing operation, wherein both sides of a wafer are scrubbed, described above, many drawbacks exist in prior art systems. For example, as mentioned above, in the scrubbing operation, wherein both sides of a wafer are scrubbed, the substrates must be kept wet prior to and during the cleaning operation, requiring sprayers to keep the wafers wet. Because of the spraying, the sender station requires a lid or cover to prevent any liquid from spraying outside the station. Similarly, as the scrubbing operation is a wet process with various liquids being sprayed on the substrate and/or brushes, this station too requires a lid or cover. The cover has a square or rectangular cross section and is attached to the back of the machine by hinges. One difficulty with the cover is that if it needs to be lifted, liquid frequently drips off the lower front lip as it is lifted. One problem which occurs is that as the cover is lifted, the front lip is disposed over the edge of the enclosure of the station or may extend outside of the enclosure, causing liquid to drip on the external portion of the station, and/or the surrounding floor. The water that drips outside of the enclosure for that station may get into the machine, potentially causing some damage. In any event, water dripped outside of the enclosure typically increases the contamination level in and around the machine. Additionally, some dripping may occur within the station as the cover is lifted. Depending upon where and when this liquid drips, it may contaminate the wafer. A further problem is that some dripping may occur off the inner top surface of the cover when it is closed due to accumulation of fluid beyond what can adhere to the top surface without dripping. For example, in a scrub station, liquids, including solutions of various detergents or other chemicals may build up, concentrating contaminants, and eventually drip. The dripped on fluid may not be removed during the cleaning process, especially if the drip occurs after the last brush station, resulting in contamination of the substrate.

As a wafer is processed, it is passed from one station to next. For example, the sender sends a wafer to the first brush station where it is scrubbed. As mentioned above, the wafer may be sent by a conveyor belt type mechanism having belts which contact the wafer from the underside. As the belts turn, they move the wafer out of the cassette and toward the next processing station. Typically, the entire mechanism itself moves to bridge the gap between the two stations and pass the wafer to another conveyor belt mechanism in the next station. Alternatively, other similar mechanisms may be used. One problem that occurs in transporting the wafer is that as the wafer is wet, it may drip, causing fluid to flow in the interface between the two processing modules. Additionally, the transport mechanism may convey and drip liquid between the modules. The contribution from the transport mechanism may be minimized by, as described above, moving the entire transport mechanism to bridge the gap between stations when conveying a wafer, and then moving it away from the gap at all other times. However, this does not entirely eliminate dripping between stations from the conveyor mechanism. Additionally, this method may not be as convenient as placing a conveyor permanently between stations. Since many of the fluids may contain contamination from the wafers, or dissolved cleaning chemicals, as the dripped material dries, flaking is a problem. This increases the level of contamination, and may cause damage to the system. To remedy this, a thin flexible piece of a plastic type material is placed over the interface of the two enclosures. This method is not entirely satisfactory as some liquid may get underneath the plastic and between the two enclosures. Bacteria can easily grow in this still liquid and eventually get on the wafers as contamination. Additionally, the plastic may move or be ripped, etc.

In some cases, a wafer transport mechanism may move to a location to bring a wafer to a processing point and then move out of the way during processing. For example, a transport mechanism may move into position to transport a wafer from the final scrub station into the spin dry station. Once the transport mechanism has conveyed the wafer to a position where the fingers of the spindle wafer holder of the spin station can grasp it, the transport mechanism moves out of the way. The transport mechanism typically is coupled to a carriage which moves along a single rail. Often, the portion of the transport mechanism not coupled to the rail is extremely unstable due to the long cantilever bending moment, leading to misalignment of the transport mechanism relative to the fingers of the spindle wafer holder. This can cause a wafer to be dropped as the fingers attempt to capture a wafer while positioned on the transport mechanism.

As described above, in the load station the cassette of wafers is lowered until a wafer is sensed by a sensor. Since the wafer is in a stacked cassette, a sensor which detects an interruption in an optical pathway cannot be used. Rather, in this application, a capacitive sensor may be used, which detects an increase in capacitance when the wafer reaches a specified distance above the sensor. Alternatively, a reflective optical sensor having some type of sender and receiver which emits radiation, such as visible or infrared radiation, and receives reflected radiation from the substrate, may be used. This type of sensor depends upon receiving a signal above a certain threshold when the wafer is at a specified position. In the sender station, one problem that occurs is that water from the sprayer may be present on the sensor, leading to false results. In the case of the capacitive sensor, liquid on the surface or outer casing of the sensor may cause an increase in capacitance equal to or greater than that caused by the wafer. In the case of the reflective optical sensor, the liquid may act as a lens, either lengthening or shortening the light path, causing a wafer to be sensed too soon or too late. The sensing of wafer when none is present is problematic in that operations must cease, as the computer system expects a wafer to be present, and therefore assumes an error has occurred when no wafer is sensed at the downstream station.

In addition to the above-described sensor in the load station, other stations downstream of the sensor typically comprise one or more sensors to determine the position of the wafer, and/or for example to determine the position of the flat on the wafer as it is being processed. In the downstream modules, since a single wafer and not a stacked cassette, is to be detected, a through-beam optical sensor may be used to detect the presence of a wafer. The through-beam optical sensor comprises two components. A first component sends a signal such as light or infrared radiation. The first component is typically mounted to some part of the system's frame or to another mechanism. The second component receives the signal and is similarly mounted to the frame or another component. The second component is mounted opposed to the first component such that when a wafer is present between the two, its presence is sensed by the interruption of the signal. One problem with these sensors is that during construction of the system, or reassembly after repair or maintenance, the two sensors must be precisely aligned. Even if the two components are initially precisely aligned, they may become misaligned due to the movement of the parts of the system over time. In such a case, the receiver may not receive a sufficiently strong signal when no wafer is present so that a wafer is detected even in the absence of a wafer. Additionally, some of the sensors must be repositioned for different sized wafers, requiring an alignment operation each time wafer size is changed.

As described above, a system may comprise two brush stations. This is typically needed because the incoming wafers are extremely dirty, requiring the first station to clean the bulk of the material, and the second station to reduce contaminants down to extremely low levels required for satisfactory yields. One problem with the requirement of two scrub stations is that each station must be aligned to the proceeding and preceding stations, so that an increase in the number stations increases the complexity of the system. Additionally, the requirement of a separate module increases the number of parts and complexity of the system.

As is well known, in all processing systems it is desired to keep the wafer as clean as possible, and particularly in a system such as a scrubber, wherein both sides of a wafer are scrubbed, whose purpose it is to clean the wafer. In prior art systems, the system may contribute some particulates due to the layout of the system. For example, as described earlier, the bottom portion of the modules are open to allow for connection to the facilities in the lower portion of the system. As described earlier, there is typically a laminar flow flowing from above and then through the system, including through the processing modules, into the chassis, and then out the back and/or side of the system. Because of the numerous components, etc., much of the flow is not laminar in the lower portion of the machine but rather may comprise turbulent flow, diffusion effects, eddy currents, thermal currents, etc. This is particularly problematic if air from the dirty side, e.g. the scrub stations, mixes with the clean side, e.g. the output station. Because of the mixing and eddy currents, airflow beneath the system may transport contamination from the dirty side to the clean side. An additional system layout related problem is that contamination from the lamp and related structures may reach the wafer before, during or after drying. As noted earlier, a laminar airflow exists from above the wafer being dried. The heat lamp is disposed directly above the wafer, in the path of the laminar flow. As the lamp and/or wires heat up and cool down, and as the machine vibrates, particulates may be thrown off which then reach the wafer through the laminar airflow. It will be appreciated that contamination at this point is extremely detrimental as the wafer has already completed the cleaning process.

A wet processing system such as a scrubber, wherein both sides of a wafer are scrubbed, typically comprises numerous chemicals with which to clean and scrub the wafer. For example, various solutions of detergents, solvents, acids, bases, and surfactants, as well as D.I. water, are flowed through one or more nozzles. Each of these is controlled by a flow controller which is typically coupled to a flow meter. The flow controllers and meters are usually disposed on a panel in an easily visible section of the system, so that the flow may be readily monitored. However, the connections to the flow meters are on the backside of the panel, internal of the machine, so that the machine must be opened up to connect the chemicals. This can be a time consuming process, as each input and output line must be connected to the correct flow meter so that appropriate chemicals are flowing to the appropriate nozzles, and so that the flow controllers and meters are controlling and measuring the fluid for which they labeled. This is a difficult task because as the flow controllers and meters are outside of the machine, and the appropriate connections are inside the system, one cannot see the flow controller to which each backside connection belongs. Obviously, an incorrect connection may cause damage to processed wafers until the error is discovered.

What is needed is a system and apparatus which provides for processing of a wafer without adding contamination through, for example, dripping from the cover, leakage between modules, contamination from laminar airflow mixing, and contamination from a structure disposed above the processing apparatus such as a heat lamp. What is additionally needed is a system having a method and apparatus for sensing a wafer in a wet environment which may reliably detect a wafer even in the occasional presence of water built-up on the sensor. Additionally, it is desirable to provide sensors for sensing a wafer which are not subject to misalignment overtime, and which may be easily positioned to accommodate different size wafers, or different sensing locations without requiring alignment. What is further needed is a method and apparatus providing for stable operation of moveable transport mechanisms. Further, what is needed is a method and apparatus for reduced components and reduced alignment between modules in a system having several modules. What is also needed is method and apparatus for connecting fluids to the system which may be done easily, with reduced risk of incorrect connections.

SUMMARY OF THE INVENTION

An improved substrate processing system is disclosed. The methods and apparatuses of the present invention may be used, for example, in a scrubber such as those used to scrub both sides of a semiconductor wafer. Embodiments of a system having covers for the wet processing station which do not drip on the wafer during processing, and which do not drip outside of the enclosure when opened are disclosed. Further, transport tunnels for transporting wafers between modules are disclosed which are sealed from the interface between the modules, thereby preventing leakage between the modules. A carriage stabilizer is disclosed which stabilizes a moveable transport mechanism when it is in position to transport a wafer. Additionally, in an embodiment having two brush stations, the two brush stations are disposed in a single enclosure eliminating leakage between two modules and reducing the number of parts and complexity of the system, and eliminating the need for alignment between the two brush boxes. Also disclosed is a method and apparatus for reliably sensing a wafer in a wet environment by using two sensors which must both sense the wafer in order for the wafer to be considered detected. Also in a preferred embodiment, through-beam wafer sensors are mounted in a fixed relationship to one another such that no alignment is necessary. The entire structure having both the send and receive components of the sensors may be moved to provide for sensing in different positions as is needed for different wafer sizes. Additionally in a preferred embodiment, the heat lamp in the spin dry station of the present invention is offset from directly above the wafer and shielded therefrom to eliminate contamination from the lamp and associated wiring and mounting. In the main enclosure for the system, an airflow control bulkhead is disposed between the clean and dirty side of the system to prevent intermixing of the airflow. Various components of the system such as the fluid flow control and meters are mounted on a transparent panel, allowing for easy connection. In the present invention, a system having less contamination, greater reliability, less complex and less costly construction, maintenance, and hook-up is achieved by use of the foregoing methods and apparatuses.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1B shows a schematic cross-sectional diagram of a wafer processing system according a currently preferred embodiment of the present invention.

FIG. 2C shows the cover of FIG. 2A in an open position in a currently preferred embodiment of the present invention.

FIG. 5B shows a wafer sensor used as a flat finder in a currently preferred embodiment of the present invention.

FIG. 6 shows a carriage stabilizer in a currently preferred embodiment of the present invention.

DETAILED DESCRIPTION

Improved methods and apparatuses for substrate processing are disclosed. In the following description, numerous specific details are set forth such as specific materials, dimensions, configurations, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although the present invention is described in conjunction with a scrubbing operation, wherein both sides of a wafer are scrubbed on a semiconductor substrate, it will be appreciated that the present invention may be used in numerous substrate processing operations.

Figure 1A:
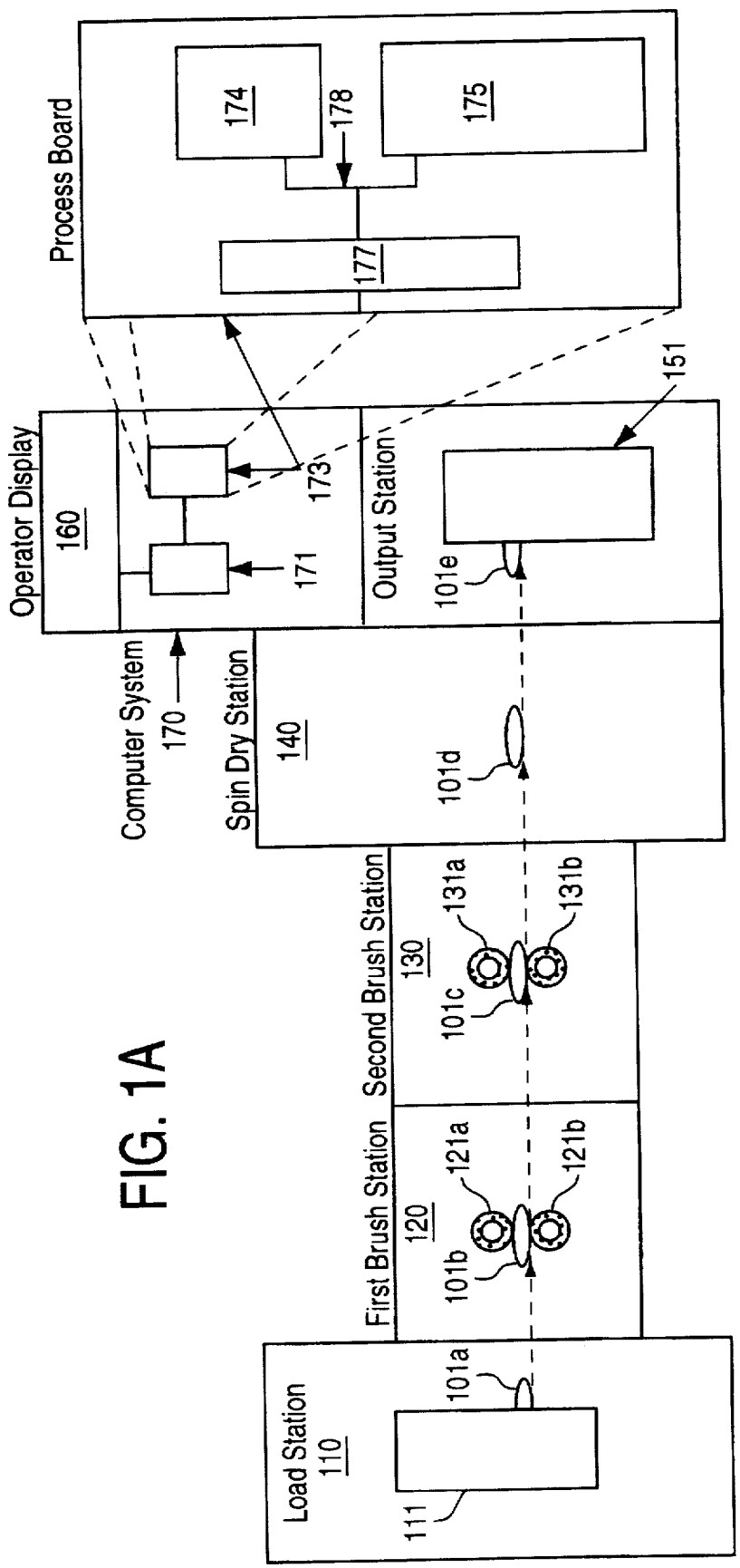
FIG. 1A shows a block diagram of a system according to a currently preferred embodiment of the present invention.

FIG. 1A shows a block diagram of a wafer scrubber, wherein both sides of a wafer are scrubbed using the methods and apparatuses of the present invention. As shown, a wafer 101a exits cassette 111 from load station 110. The wafer 101a will be denoted as 101a, 101b, etc. as it proceeds through the stations or modules of the scrubber, to illustrate the process flow. It will be appreciated that in operation, each of the stations may be processing a different wafer at the same time. Although the present invention is described in conjunction with a semiconductor wafer, it will be appreciated that any similarly shaped, i.e. generally flat substrate, may be processed by the methods and apparatuses of the present invention. Further, it will appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparatuses and devices such as flat panel displays, multichip modules, etc. After exiting cassette 111, the wafer 101a enters first brush station 120 where, as shown by wafer 101b, it is scrubbed on the top and bottom sides by brushes 121a and 121b. The wafer next enters second brush station 130, and as shown by wafer 101c, is scrubbed by brushes 131a and 131b. Next, the wafer enters spin dry station 140 where it is rinsed with D.I. water and, additionally if desired, treated with megasonic energy to further remove particles. Next, the wafer 101d is spun dry while being heated with a heat lamp (not shown in FIG. 1A). After the spin dry operation, the wafer is sent to output station 150 and loaded in cassette 151 as shown by wafer 101e.

Computer system 170 controls the operation of various stations in the scrubber. Computer system 170 typically includes processor board 173, which includes a processor 174 and memory 175. The processor 174 communicates with the memory 175 via internal bus 178. The processor 174 communicates with an input/output circuit 177 which allows it to communicate with the stations and with the video card 171. Video card 171 generates a video signal for the operator display 160. The operator display 160 typically includes a monitor such as cathode ray tube, flat panel display, etc. In one embodiment, operator display 160 also includes a touch sensitive screen allowing the operator to interact with the computer system 170.

The processor 174 executes programs, stored in the memory 175, to control the stations. In one embodiment, processor board 173 includes a processor board from Gespac, Inc., of Scottsdale, Ariz. (a Motorola 68000 based processor board, part number SBS6A). The memory 175 may include 2 MBytes of random access memory (RAM) for data and code, and a 256K EEPROM, for code. A typical video cart 171 may also be purchased from Gespac, Inc. (part number VIG-4W). Note that the above-described computer system 170 is but one embodiment, and one of ordinary skill in the art will appreciate that other embodiments are possible.

Figure 1C:
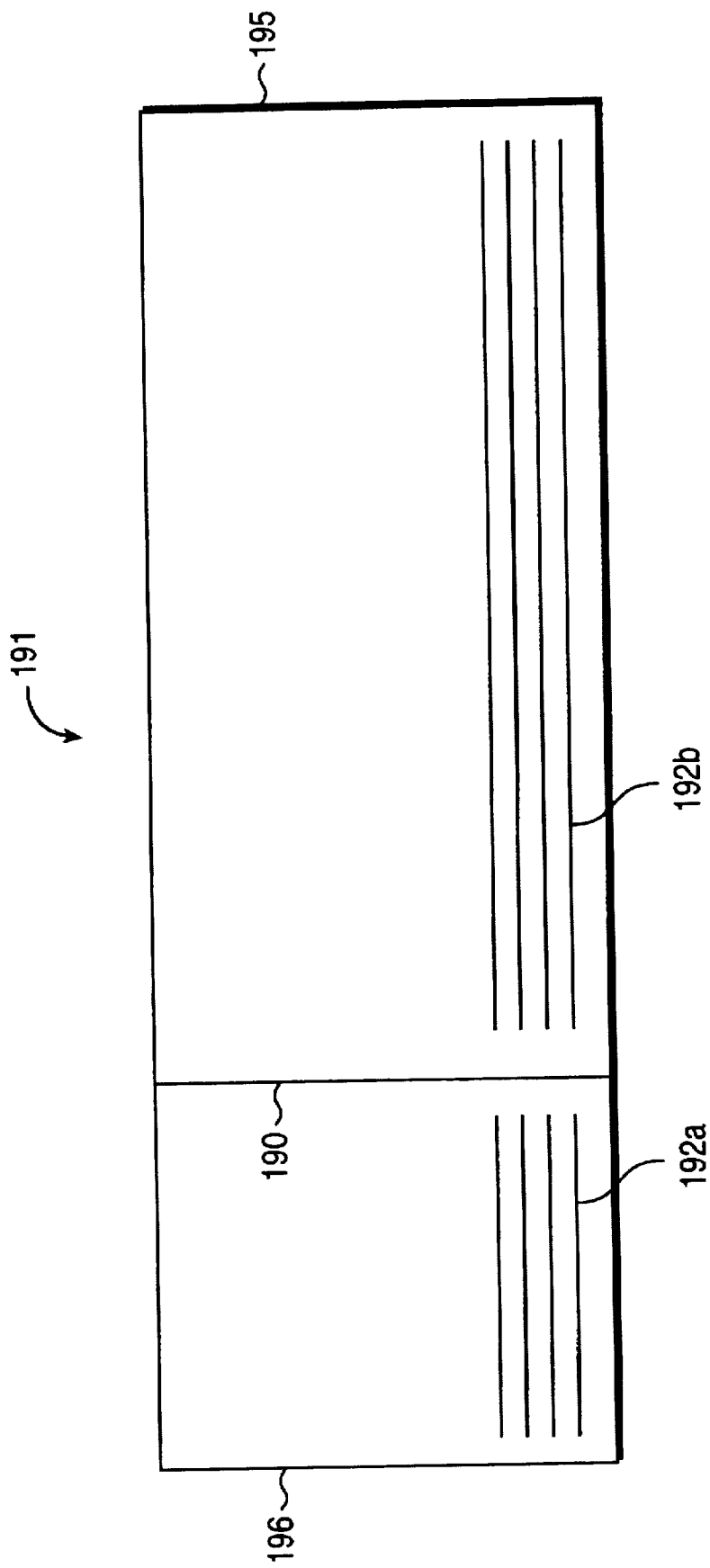
FIG. 1C shows a view of the back side of the system of FIG. 1B.

FIG. 1B shows a cross sectional view of the wafer scrubber illustrated in FIG. 1A. As described in relation to FIG. 1 A, a wafer exits cassette 111 and is transported into first brush station 120. The wafer is transported through tunnel 119 which will be shown in more detail in FIGS. 3A, 3B, and 4. In the currently preferred embodiment, brush station 120 comprises sprayers 122a, 122b and 122c which spray one or more chemicals and/or deionized water onto the wafer and/or brush during scrubbing. These sprayers will be described in more detail in relation to FIGS. 3A and 3B. Next, the wafer is transported through opening 129 in divider 302 to brush station 130 where it is brushed by brushes 131a and 131b on the top and bottom sides, respectively. During the scrubbing, fluid is supplied via sprayer 132a. Next, at the end of brush box 130 the wafer is sprayed with deionized water through sprayer 132b as it exits brush box 130 through tunnel 139. In station 140 the wafer is transported via a roller transport mechanism (not shown in FIG. 1B) to a central portion of the spin dry station 140. The roller transport mechanism, which is shown in detail in FIG. 6, is disposed on a carriage which rides along a rail so that the conveyor mechanism can move back and forth to place the wafer within the nest of a wafer holder 145 of FIG. 1B which holds the wafer by its edges during drying. For an example of a wafer holder 145 used in a currently preferred embodiment, see co-pending patent application entitled "Spindle Assembly With Improved Wafer Holder" by John S. Hearne, filed Jul. 1, 1994, which application is assigned to the assignee of the present invention. The heat lamp (not shown in FIG. 1B) is disposed within the upper portion of spin dry station 140. The heat lamp will be discussed in more detail in relation to FIG. 7. After the dry operation is complete, the transport mechanism moves into position to convey the wafer from spindle wafer holder 145 to output station 150. In output station 150, robotic arm 155 picks up the wafer from the transport mechanism and places it sideways in cassette 151. Cassette 151 is disposed sideways to prevent accumulation of particles on the wafers.

Figure 2A:
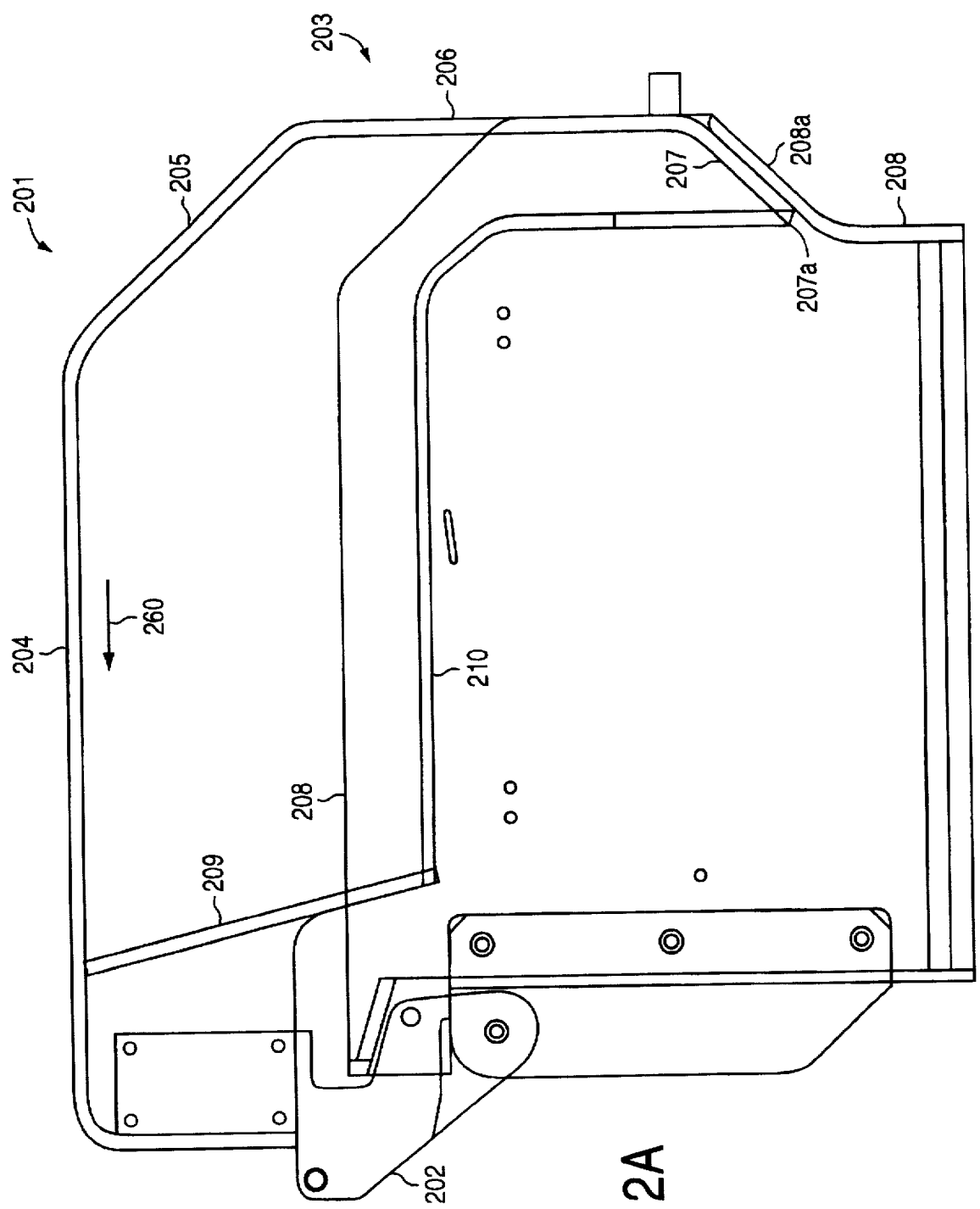
FIG. 2A shows a cover for a processing station in a closed position in a currently preferred embodiment of the present invention.
Figure 2B:
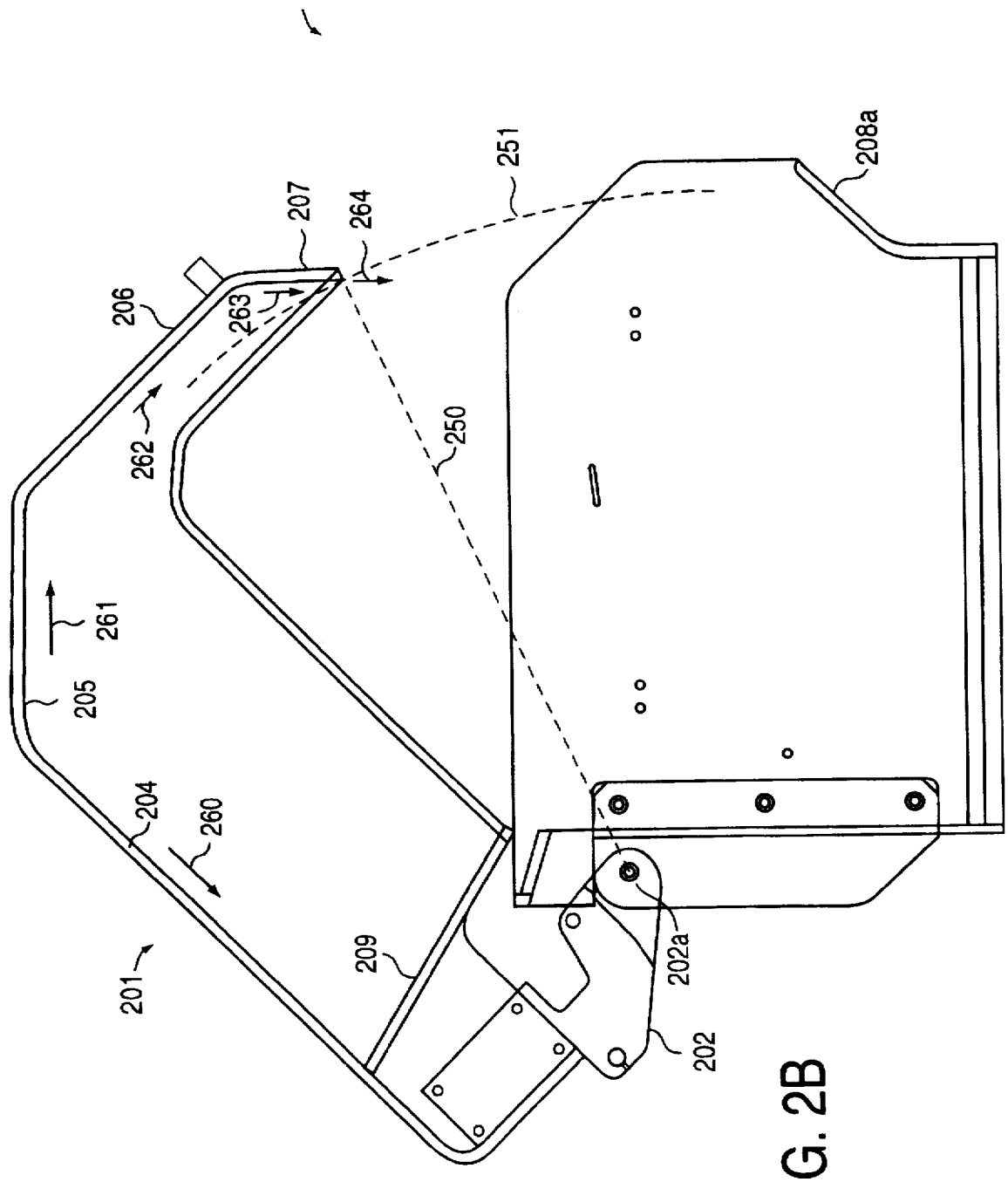
FIG. 2B shows the cover of FIG. 2A in a partially open position in a currently preferred embodiment of the present invention.

FIG. 2A–2C show cover 201 which covers load station 110 in a currently preferred embodiment. In a preferred embodiment, cover 201 is made of acrylic. In FIGS. 2A–2C, a cross sectional view of the cover, 201 in a direction perpendicular to that shown in FIG. 1B, is shown. In FIG. 2A, cover 201 is shown in the closed position. As described earlier, sprayers 113 constantly spray the wafers in cassette 111. Due to the spraying, liquid may accumulate on the cover 201. In normal operation, the system 100 operates automatically, and there is no need to open covers to gain access to the system. However, on occasion, a problem will arise, such as a stuck wafer, requiring access to one of the stations. Generally, the load station 110 has the greatest frequency of requiring access, compared with the other stations. Typically, of course, although load station 110 may have a higher frequency of such incidents than the other stations, the overall rate of such incidents is generally low. However, as described earlier, in the prior art, one problem that occurred is as the prior art cover is lifted, liquid may drip off the lower edge of the front section of the cover, into the working parts of the machine.

In the present invention, this problem is avoided by the shape of the front 203 of the cover 201. While cover 201 is closed, as shown in FIG. 2A, liquid accumulating on front section 203 runs down portion 205 to portion 206, and then to portion 207. In a currently preferred embodiment, the dimensions of these sections along the portion shown in the cross-sectional view of FIG. 2A are approximately: section 204—14 inches; section 205—5.5 inches; section 206—6.75 inches; section 207—2.3 inches. Of course, these dimensions may vary depending upon the dimensions and configuration of the station cover 201 covers. All liquid from any one of the portions 205, 206 and 207 of front section 203 runs off of the edge 207a into enclosure 208. Liquid on the sides of the cover 201 parallel to the plane of the Figure simply drips down the sides and into the enclosure 208. As shown, the lower edge 210 of the side of the cover is disposed within and below the upper edge of enclosure 208. The positioning of cover 201, when closed, may be more readily comprehended by comparison of FIG. 2A to FIGS. 2B and 2C, discussed below.

FIG. 2B shows cover 201 in a partially open stage. In the present invention, as cover 201 is opened, liquid on the front section 203 continues to flow off of the front edge 207a, onto or near lip 208a of enclosure 208 away from the outside of the enclosure and away from central portions of station 110. Fluid on the top 204 flows off the top section 204 to the back section 209 as the cover is opened. Specifically, in the position shown in FIG. 2B, liquid on the upper section 204 flows along the upper portion 204 in the direction shown by arrow 260 to back section 209, from where it flows down the back of the enclosure 208. Thus, back section 209 prevents liquid from flowing outside of the enclosure along the hinged portion as may occur in the prior art. As shown in FIGS. 2A–2C, so long as back section 209 is in an orientation such that liquid is flowing downward, the lower edge of section 209 is within the enclosure. Liquid present on the inner surface section 205 flows along section 205 in the direction shown by arrow 261 to section 206. From there the liquid flows as shown by arrow 262 to section 207 where it flows as shown by arrow 263 to the edge 207a. From there the liquid drips down as shown by arrow 264 again to the lip 208a of the enclosure 208. At this point, virtually all of the liquid has flowed off of all of the portions of front 203 onto the front of enclosure 208, or down the top section 204 to the back 209, so that no water flows outside of the enclosure 208. As the cover is further opened, to the fully opened position shown in FIG. 2C, little additional dripping occurs over the central portions of the load station 110.

It will be appreciated that numerous modifications may be made to the cover 201 to achieve the benefits of the present invention. In general, to avoid dripping outside the machine, the radius 250 from the hinge rotation point 202a to the edge 207a should be such that the arc 251 traced by the point 207a as the cover 201 is opened is always disposed above some portion of the enclosure. In this regard, the inwardly pointing lip 207 makes it possible for the lower most edge 207a to stay within the enclosure, as shown. Other shapes that may be used include, for example, a front section forming an arc or partial circle, such that the lower lip stays within the enclosure as described. As a further alternative, the cover need not comprise a back section as such but rather may have the top hinged directly to a portion of the enclosure 208. In such an arrangement, some type of shield between the top and enclosure along the hinged section (e.g., a flexible strip) is desirable. The general shape shown in FIG. 2A–2C has been found to achieve the benefit of preventing water flow outside of the enclosure, while providing sufficient room for processing apparatus within the enclosure, without being unduly oversized or bulky.

Figure 2D:
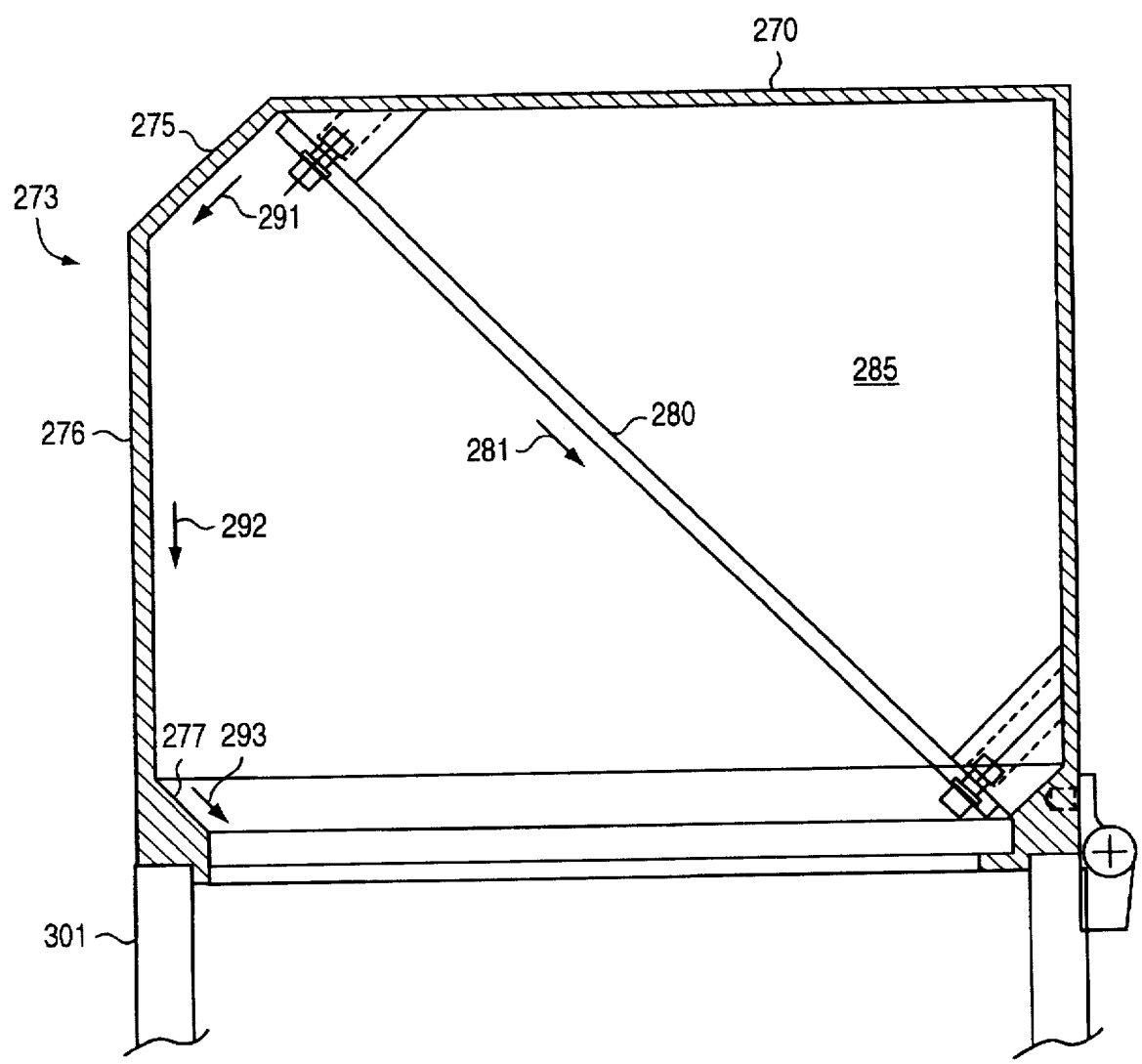
FIG. 2D shows a further currently preferred embodiment of a cover for a processing station of the present invention.

FIG. 2D shows a cross sectional view of cover 270 used to cover both of the brush stations 120 and 130 in a currently preferred embodiment of the present invention. In a currently preferred embodiment, cover 270 is made of acrylic. Cover 270 comprises a front section having portions 275, 276, and 277 which are generally similar to portions 205, 206, and 207 of cover 201. In a currently preferred embodiment, the dimensions of these sections are approximately: section 275—5.3 inches; section 276—7.35 inches; section 277—0.5 inch. As with cover 201, these dimensions may vary depending upon the configuration of the station cover 270 covers.

When cover 270 is closed as shown in FIG. 2D, liquid flows off of the sections 275, 276 and 277 as shown by arrows 291, 292 and 293, respectively, similar to the flow off of front section 203 of cover 201. In operation, the brush stations 120 and 130 result in some spraying and/or splashing and/or condensation on the top of cover 270 due to the presence of sprayers and spinning brushes in the brush stations. Therefore, some amount of liquid may collect on the top of a cover in the absence of the present invention. Importantly, although the amount of liquid reaching the cover 270 in brush station 120 and 130 is much less than the amount reaching cover 201 of load station 110, any dripping of liquid from the top in the brush stations 120 and 130 is potentially more damaging than dripping of water in the load station 110, as the brush stations 120 and 130 may contain solutions having chemicals in addition to water. Furthermore, when exiting station 130, the wafer is at a point where no further scrubbing will occur, so that dripping may more readily damage the wafer. Therefore, in the present invention, cover 270 comprises a panel 280 which, as shown, is at an angle (approximately 45°) from the front top corner to the rear bottom corner. When sufficient liquid accumulates to flow during processing, instead of dripping down on the wafer it will flow down along the inner surface of panel 280, as shown by arrow 281 and from there be collected in the enclosure. In a currently preferred embodiment, panel 280 has dimension of approximately 13.5 inches. As can be seen from the figures, panel 280 is coupled to cover 270 by use of screws, for example. This allows for removal of panel 280 to enable cleaning of the surfaces within the region 285, as some liquid may get in this area through seepage, condensation, etc. Of course, if desired, the cover need not have a rectangular shape, but may simply comprise an integrated top at an angle corresponding to the panel 280. The use of an essentially rectangular, outer shape is for cosmetic purposes in the present invention.

Figure 2E:
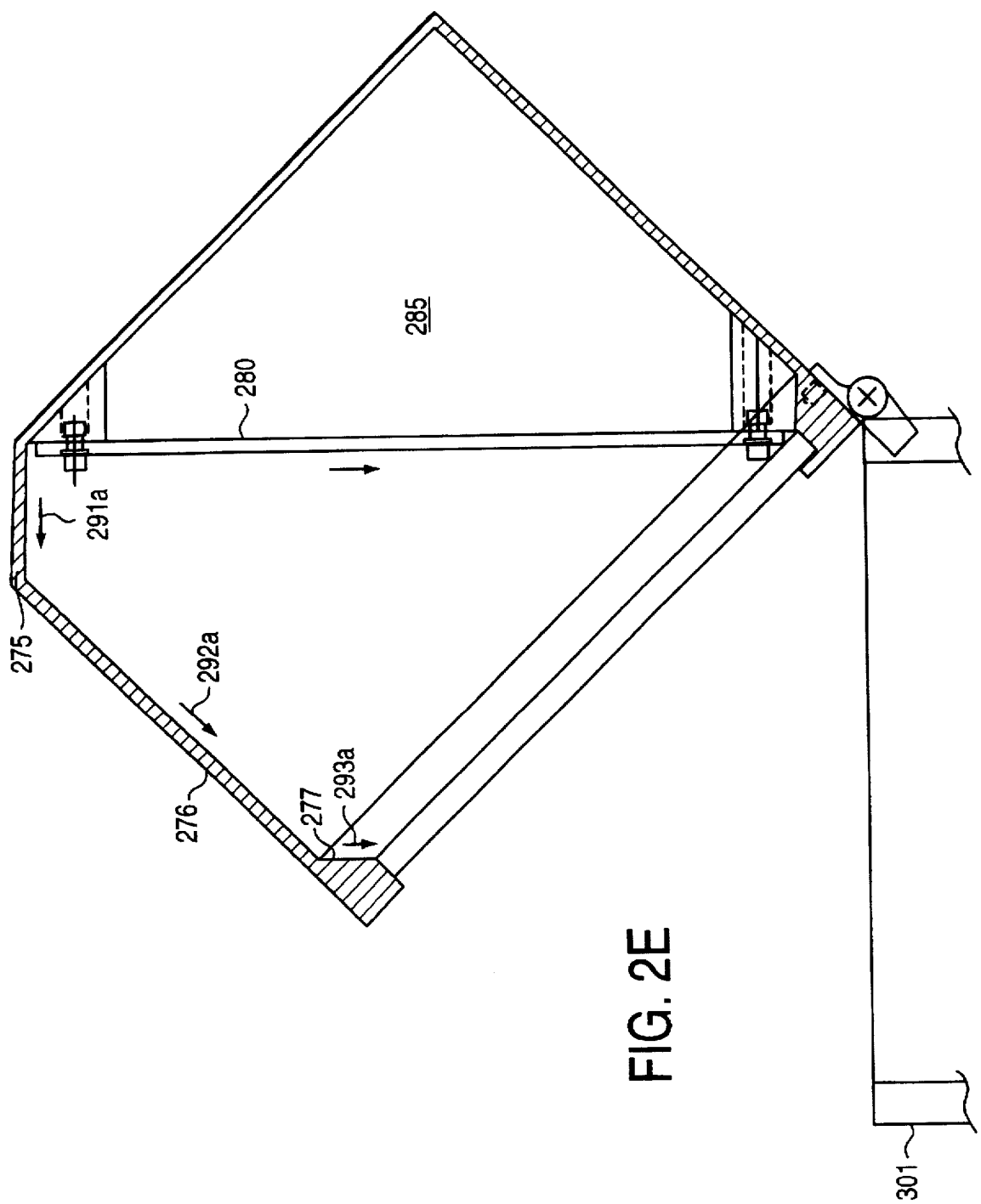
FIG. 2E shows the cover of FIG. 2D in a partially open position in a currently preferred embodiment of the present invention.

FIG. 2E shows cover 270 in a partially open position. As shown by arrow 281a, liquid on section 280 continues to flow down section 280 to the back of the enclosure. Similarly, as shown by arrows 291a, 292a and 293a, liquid on the front portion 273 continues to drip within the enclosure 301, similar to the situation described in conjunction with FIG. 2B for cover 201. It will be appreciated that many different shapes of covers using the concepts of the present invention may be utilized, depending upon the specific needs and constraints of the system. For example, in the load station 110 the primary concern is to prevent flow outside of the enclosure, as the fan-shaped spray out of the sprayer 113 results in significant liquid build-up on the enclosure. As shown in FIGS. 2A–2C, in a currently preferred embodiment, no panel such as panel 280 is present within the cover 201 because dripping on the substrate is not problematic in the load station 110 compared with the brush stations 120 and 130 since the wafers are dirty at this location, since they are constantly kept wet by the sprayers 113, and since sprayers 113 spray the D.I. water so that there is no risk of increased chemical concentration or particulate matter due to process chemicals coming out of solution, as may occur in the scrubber modules. In the scrubber modules, there is generally less total liquid sprayed on the cover. However, as it is potentially more damaging for reasons described earlier, the panel 280 which prevents gradual build-up and dripping of chemical solutions, is extremely beneficial in these stations. Of course, if desired, any combination of the principles of either cover 201, or cover 270, can be used in either module. For example, a cover 201 having a panel 280 or similar structure may be used in the send station, brush station or other wet processing station. Similarly, if desired, the cover 270, with or without the panel may be used in any station. Of course, it will typically be desirable to have the angled panel 280 in the scrub station to prevent chemical dripping. It should be noted that the cover 201 keeps the edge 207a over the outer portion of the enclosure for a significant distance during opening, such that most flow occurs into the outer portion of the enclosure and not the central portion having the substrate processing apparatus. However, as the scrub station cover is typically opened much less frequently than the load station 110 cover 201, this is not as great a concern, so that the cover 270 may be used in the brush stations 120 and 130. The configuration of cover 280, with its relatively square front section, is beneficial because the brush stations 120 and 130 have equipment mounted in the front portion thereof, such that the greater amount of room made available by use of the cover 280 in the brush stations 120 and 130 is beneficial. It will be appreciated that one advantage of the panel 280, or similar panel of the present invention, is that dripping from the top may be prevented, without requiring a cover of unwieldy height.

Figure 3A:
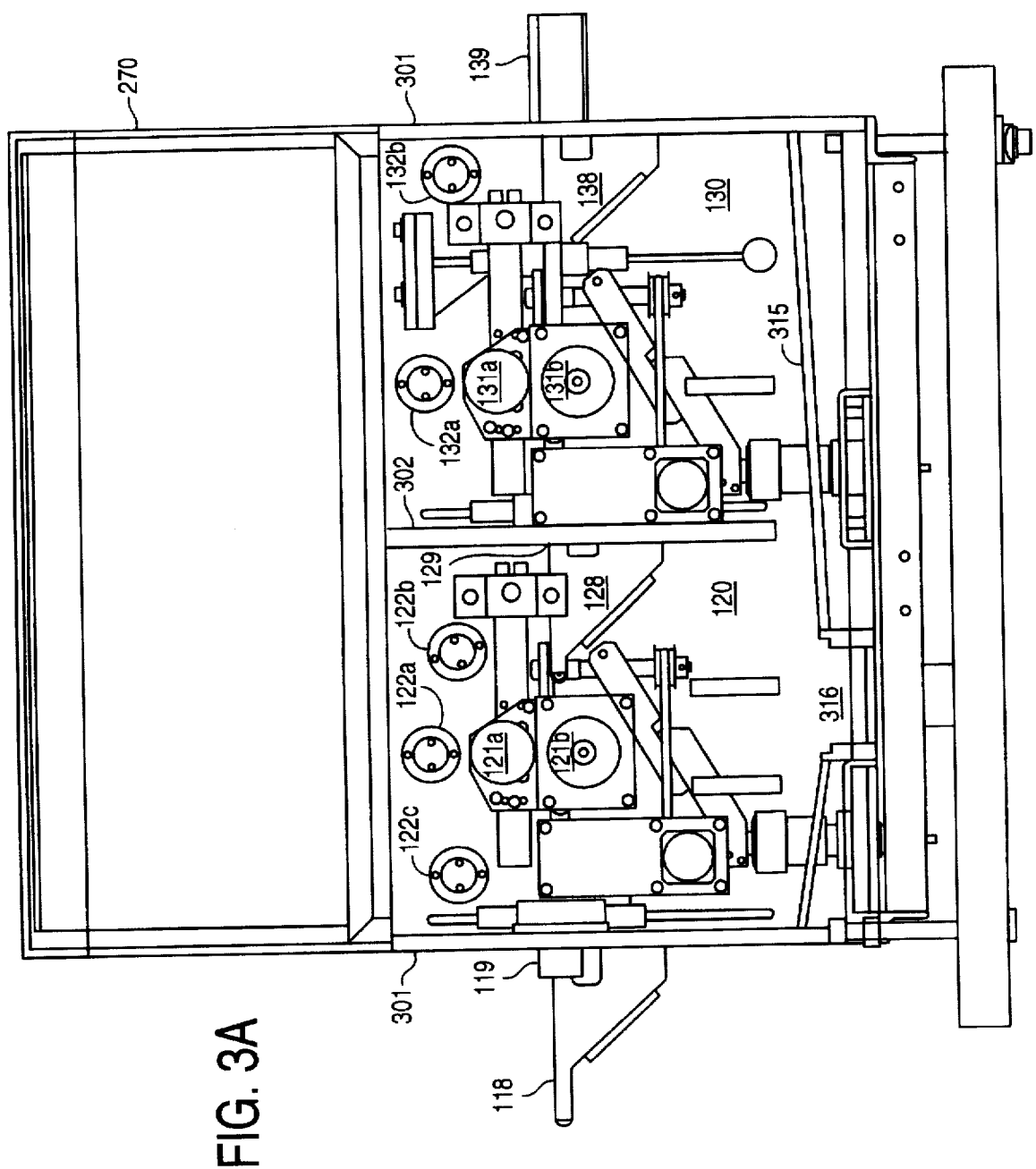
FIG. 3A shows a top view of a dual brush station in a currently preferred embodiment of the present invention.

FIG. 3A shows a side view of brush stations 120 and 130. As shown, both brush stations 120 and 130 are disposed within a single enclosure 301. Also as shown, a divider 302 separates the two brush stations. In a currently preferred embodiment, enclosure 301 and divider 302 are made of polycarbonate. As can be seen, a wafer may be transported on transport mechanism 118, which is a conveyor belt-type mechanism in a currently preferred embodiment. Tunnel 119 extends through the station 110/station 120 interface, so that a wafer may be transported from load station 110 to first brush station 120 without liquid from either the wafer or the transport mechanism 118 dripping between the two stations. Tunnel 119 will be discussed in more detail in conjunction with FIG. 4. In the prior art, a transport mechanism does not extend across the two modules, since this would lead to constant leakage between the two. In the present invention, by virtue of tunnel 119, the mechanism 118 can be permanently disposed within the tunnel to transport wafers between modules without worry of leakage in between the modules. In this way, the complexity of the system is reduced since a mechanism for moving the entire transport mechanism 118 back and forth between modules is not required. In a similar manner, transport 128 extends through an opening 129 in divider 302 to pass the wafer into brush station 130. No tunnel such as tunnel 119 is required in divider 302 since the two brush stations are already in a single enclosure. Similarly, after the brushing in brush station 130 the wafer is passed via transport mechanism 128 through tunnel 139 to the spin rinse dry station 140 of FIGS. 1A and 1B. In the brush stations 120 and 130, components which cannot be contacted by fluids, such as the motors to turn the brushes, wafer conveyors, etc., are encased in, for example, plastic. As described earlier, fluid which collects on the covers may flow along the sides of the system. This and other fluids from the process drain off of bottom plate 315 into drain 316.

Figure 3B:
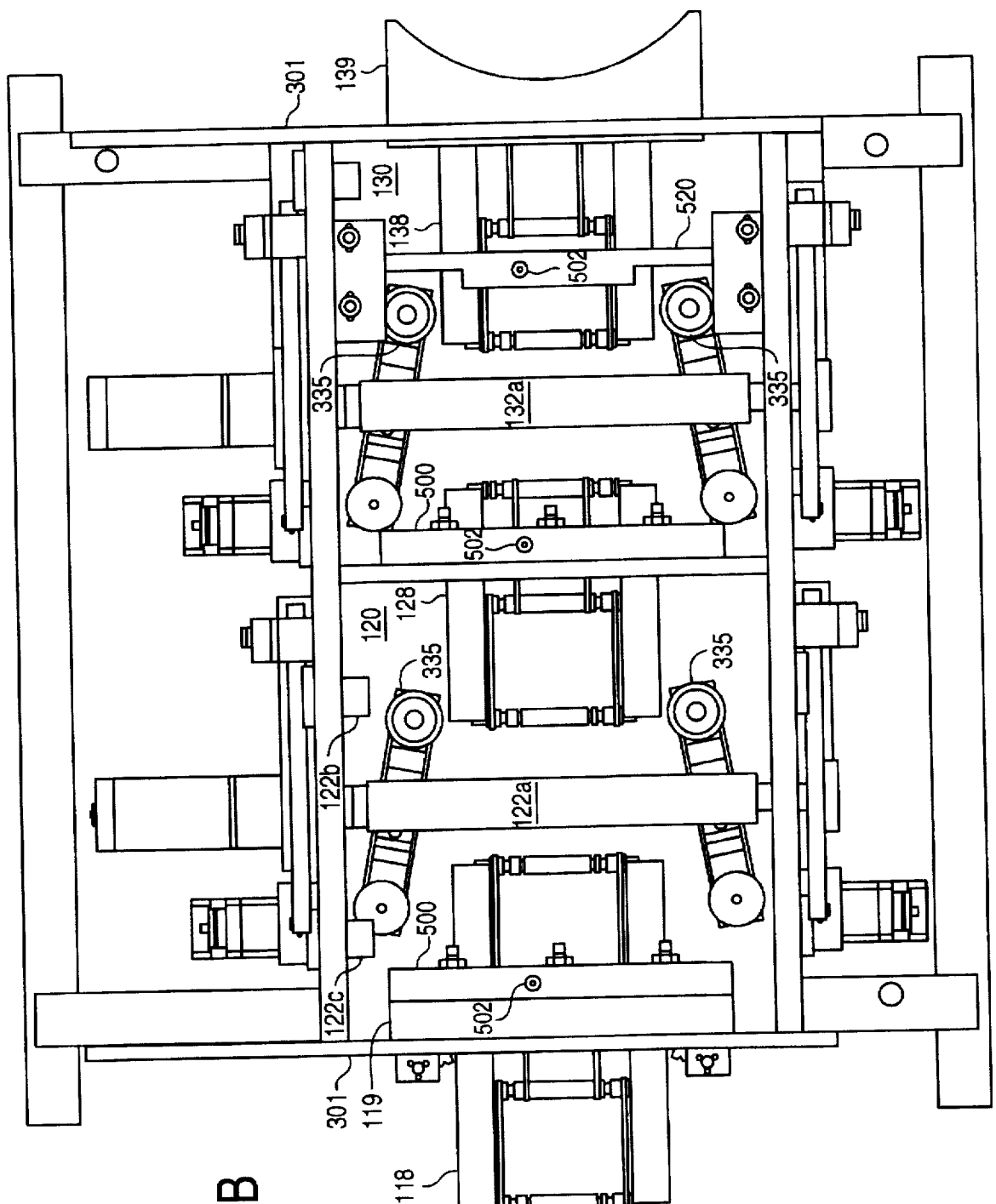
FIG. 3B shows a side, cross-sectional view of the dual brush station of FIG. 3A.

FIG. 3B shows a top view of brush stations 120 and 130. As described previously, a wafer is conveyed via mechanism 118 through tunnel 119 into first brush station 120. The presence of a wafer is detected by sensor assembly 500 which will discussed in greater detail in relation to FIG. 5A. When wafer 101b reaches the point shown in FIG. 3B, disposed between the two brushes 121a and 121b (not shown in FIG. 3B). It is contacted by wheels 335 at the leading edges. For more detail on the wheels 335 used in a currently preferred embodiment, see the co-pending application entitled "Hesitation Free Roller", by Albert M. Saenz et al. filed on even date herewith, which application is assigned to the assignee of the present invention. The wheels 335 turn and thereby rotate wafer 101b as it is being scrubbed by the brushes 121a and 121b. As can be seen from the top view of FIG. 3B, nozzles 122c and 122b spray the wafer and brushes from the side, while nozzle 122a extends across the brush station 120 and sprays directly on top of the brushes. After scrubbing in the first scrub station 120, the wafer exits via transport mechanism 128, and is sensed again by another assembly 500 in the brush station 130. The wafer is then scrubbed while rotating in second brush station 130 in a similar manner as discussed in relation to first brush station 120. After the second scrub is complete, sensor assembly 520 determines the location of the wafer's flat so that the system may position the wafer in a predetermined location, as will be discussed in relation to FIG. 5B. Next, transport mechanism 138 transports the water through tunnel 139, which is generally similar to tunnel 119, to spin rinse/dry station 140. As the wafer leaves brush station 130, it is sprayed by sprayer 132b which sprays deionized water to rinse the wafer and keep the wafer wet prior to the final spin rinse and spin dry.

While the precise process sequence, chemicals, etc., which may be used in the scrubbing operation, wherein both sides of a wafer are scrubbed are virtually unlimited, a typical process in brush station 120 may comprise, for example, a first scrub for a period of time with an ammonium hydroxide solution followed by a second scrub with D.I. water. A typical process for the brush station 130 may comprise a scrub with D.I. water. As noted earlier, one use of the system 100 may be to clean wafers after an extremely dirty operation such as chemical mechanical polishing. When the wafers enter brush station 120, they have a significant amount of particulates. The bulk of these particulates are taken off in brush station 120. Although the constant flow of solution through the nozzles 122a–c removes the particles from the wafers, brushes, and transport and turning mechanisms, because of the dirty nature of the incoming wafers, the level of particulate contamination in the first brush station 120 may remain too high for semiconductor standards. By using a second brush station which cleans the wafer after the great majority of the particulates have been cleaned off, particulate levels may be reduced to acceptable levels. Note that the present invention enjoys the benefits of two discrete, separated brush stations, without requiring separate enclosures for each, and without requiring alignment between the modules. Additionally, by use of the present invention, the benefits of two brush stations are achieved, with reduced equipment requirements. For example, two separate modules require at least one additional transport mechanism and one additional tunnel. Additionally, the footprint of the system is reduced compared to a system having two separate enclosures.

Figure 4:
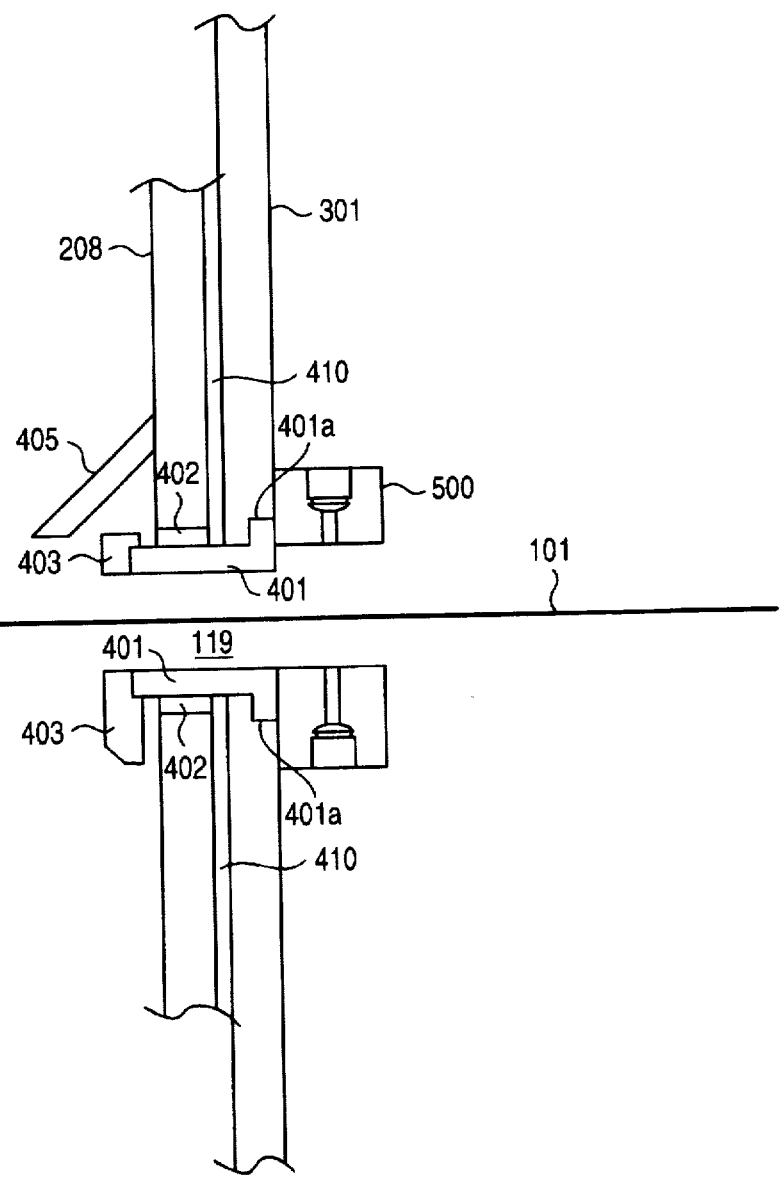
FIG. 4 shows a wafer transfer tunnel in a currently preferred embodiment of the present invention.

FIG. 4 shows tunnel 119, with wafer 101 disposed therein. As shown, tunnel 119 extends between enclosure 208 of load station 110, and enclosure 301 of brush stations 120 and 130. As shown, tunnel 119 comprises a single and continuous conduit 401 extending through the openings in enclosures 301 and 208. The conduit has lip 401a which mates into an indent in enclosure 301 as shown. With this design, sensor assembly 500 may be mounted flush against the enclosure 301 and conduit 401. Additionally, by mounting tunnel 401 such that it is flush with the enclosure 301, no additional horizontal surface, which may collect liquid, is present. As shown, tunnel 119 extends through opening 402 in the wall of enclosure 208. The opening 402 is larger than the tunnel 119 so that vibration which occurs during the operation of the brush station does not cause stress on the enclosure 208. Additionally, having an oversized opening 402 provides manufacturing tolerance in the case of misalignment between the enclosures. Tunnel 119 also comprises a lip 403 to shield the gap from fluids flowing therethrough. Additionally, a shield 405 is disposed above the tunnel on the wall of enclosure 208 to further prevent sprayed or dripped fluid from getting in or around the tunnel. The mounting of the tunnel to the enclosure 301, of the lip 403 to tunnel 119, and of the sensor assembly 500 to the enclosure 301 is accomplished through use of screws in a currently preferred embodiment. For purposes of illustration, transport mechanism 118 is not shown in FIG. 4. As can be seen, tunnel 119 allows for pass-through of the wafer 101 while completely sealing off the interface 410 between the enclosures 208 and 301 from any process fluids.

Figure 5A:
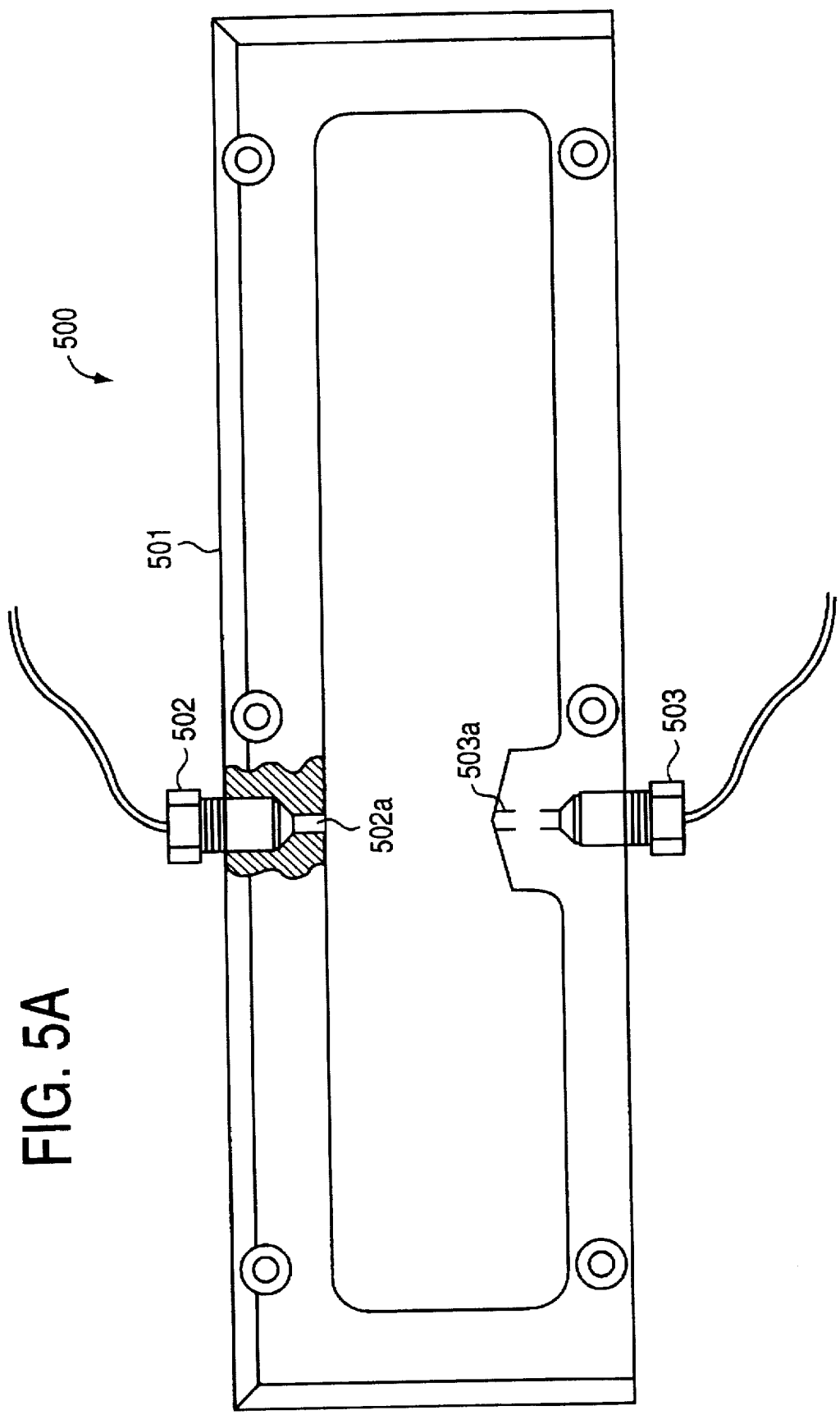
FIG. 5A shows a wafer sensor of a currently preferred embodiment of the present invention.

FIG. 5A shows a cross-sectional view of sensor assembly 500. The view of FIG. 5A is through a cross-section perpendicular to that shown in FIG. 4. As illustrated in FIG. 5A, one embodiment of sensor assembly 500 may comprise a through-beam optical sensor which includes a sender and a receiver. It should be noted and it will be obvious to one with skill in the art that the through beam sensor detects wafers when the wafer is located between the sender and the receiver and interrupts the signal being sent from the sender to the receiver. As shown, upper component 502, which comprises a sender is mounted within a matching recess in the frame 501. Also as shown, lower component 503, which comprises a receiver is also disposed within a matching recess in the same frame 501. The components 502 and 503 are not shown in the view of FIG. 4. The frame 501 is premanufactured such that components 502 and 503 are in a fixed relation, pointing at one another. As shown in FIG. 5A, the frame 501 comprises openings 502a and 503a to provide an unobstructed optical path. As described earlier, in the Background of the Invention, prior art through-beam optical sensor assemblies have a component similar to component 502 is mounted to, for example, a bracket attached to the system's frame or enclosure wall at a position above where it is desired to detect the wafer, and a component similar to component 503 is independently mounted to a bracket attached to the frame or enclosure wall below a position where it is desired to detect the wafer. In contrast, in the sensor assembly 500, components 502 and 503 always retain a fixed relation to one another. In this way, movement of other parts of the system such as the wafer transport mechanism does not disturb the alignment of the two sensors. This is particularly important as, for example, there may be substantial machinery intervening between the two sensor components. For example, note in FIG. 3A and 3B that the wafer transport mechanisms 118 and 128 are disposed between components 502 and 503. Additionally, the present invention makes assembly and repair of the system easier, since installation of the sensor simply requires placement of frame 501 in the desired position, for example, attached to the enclosure wall 301, tunnel 119 or divider 302 as shown in FIGS. 3A and 3B. In this way, the upper and lower portions of the sensors 502 and 503 do not need to be aligned with one another to ensure proper detection.

FIG. 5B shows sensor assembly 520, which is used to find a flat. Referring briefly to FIG. 3B, the wheels 335 are positioned such that they hold the wafer such that no portion of the wafer is present in the pathway between components 502 and 503 when the flat is disposed in this region, and such that the edge is between the pathway of components 502 and 503 when the flat is not in this region. Therefore, as the wafer rotates, the signal is interrupted until the flat reaches this region when the receiver 503 briefly detects a signal, which is again interrupted as the flat is rotated out of the flat finder. In operation, after the second scrub operation is complete, the system instructs the wheels 335 to continue to rotate the wafer until the flat is detected, i.e. the signal is detected in component 503. At this time, the rotation stops, leaving the flat between the sensor components 502 and 503. In an alternative embodiment, the system may instruct the wheels to continue rotating for a predetermined number of steps such that the flat is in a predetermined position. The positioning of the flat is designed such that the wafer holder 145 of the spin dry station 140 grips the wafer at positions other than the flat for a firm grip.

As shown in FIG. 5B, frame 521 comprises four slots 525 by which frame 520 may be coupled to the system 100, for example, by screws entering through the slots 525 from the underside of frame 521 into openings in a mounting bracket. Briefly referring to FIG. 3B, note that when different sized wafers are scrubbed, the leading edge of the wafer will be at different locations depending upon the size of the wafer. By provision of slots 525, the sensor assembly 520 can be moved back and forth to accommodate these different sizes. As is apparent, the sensors remain aligned when such an adjustment is made. Note that in the embodiment disclosed herein, the two sensor assemblies 500, as shown in FIGS. 1B, 3A and 3B, simply need to detect when the leading edge of the wafer is at the sense point, so that no accommodation need be made for different sized wafers. It will be appreciated that in other embodiments where sensors other than the flat finder need to be repositioned for any reason, provision can be made in accordance with the principals discussed in relation to sensor assembly 520, to provide for movable mounting of the sensor frame.

FIG. 6 shows wafer transport mechanism 600, which is used to transport wafers through the dry station 140 in a currently preferred embodiment. Transport mechanism 600 comprises a plurality of rollers 601 coupled by a belt (belt not shown) which turns all of the rollers. Additionally, transport mechanism comprises rings of a flexible material in each of the grooves 601a (rings not shown) which contact the wafer. Transport mechanism 600 is coupled to carriage 609 which slides back and forth along rail 610 as shown by arrow 611. The carriage 609 moves into position to receive a wafer through tunnel 139, and then transports it over rollers 601 in the direction shown by arrow 612 until it is in position to be grasped by the wafer holder 145 described earlier. As described in the background section, when the carriage 609 and transport mechanism 600 are in the fully extended position to transport a wafer, the transport mechanism may be slightly unstable on the side of the mechanism 600 opposite rail 610. It will be appreciated that use of two rails, one on each side of the transport mechanism 600 would constitute an over-constrained system, such that perfect alignment of all components, and even application of all moving forces would be required to prevent binding.

In FIG. 6, carriage 609 and transport 600 are shown slightly before the fully extended position. In the present invention, to stabilize carriage 609, stabilizer tab 605 engages receptacle 606 which is mounted to the frame of the system 100. In this way, when the transport mechanism 600 is fully extended as shown by arrow 607, tab 605 is snugly in receptacle 606 such that both ends of the transport mechanism and carriage are stabilized for transport of the wafer. The tab 605 and receptacle 606 are disposed underneath the roller 601. A portion of one of the rollers 601 is cut away so that the tab 605 and receptacle 606 are visible in the figure. It will be appreciated that other shapes for the stabilizer may be used. In general, the stabilizer may comprise two or more members which contact one another when the wafer transport mechanism is fully extended. For example, a tab, bar or other member, which slides atop a shelf, may be used to prevent downward motion of the wafer transport mechanism 600. One advantage to having some type of male/female mechanism, is that the transport mechanism 600 is stabilized against motion in any direction. When transport mechanism 600 is fully extended such that tab 605 engages receptacle 606, the transport mechanism 600 is stably disposed in its design location, such that when the fingers of the spindle wafer holder 145 of spin dry station 140 reach up through the rollers to grasp the wafer thereon, the edges of the wafer are always within the fingers of the spindle wafer holder.

Figure 7:
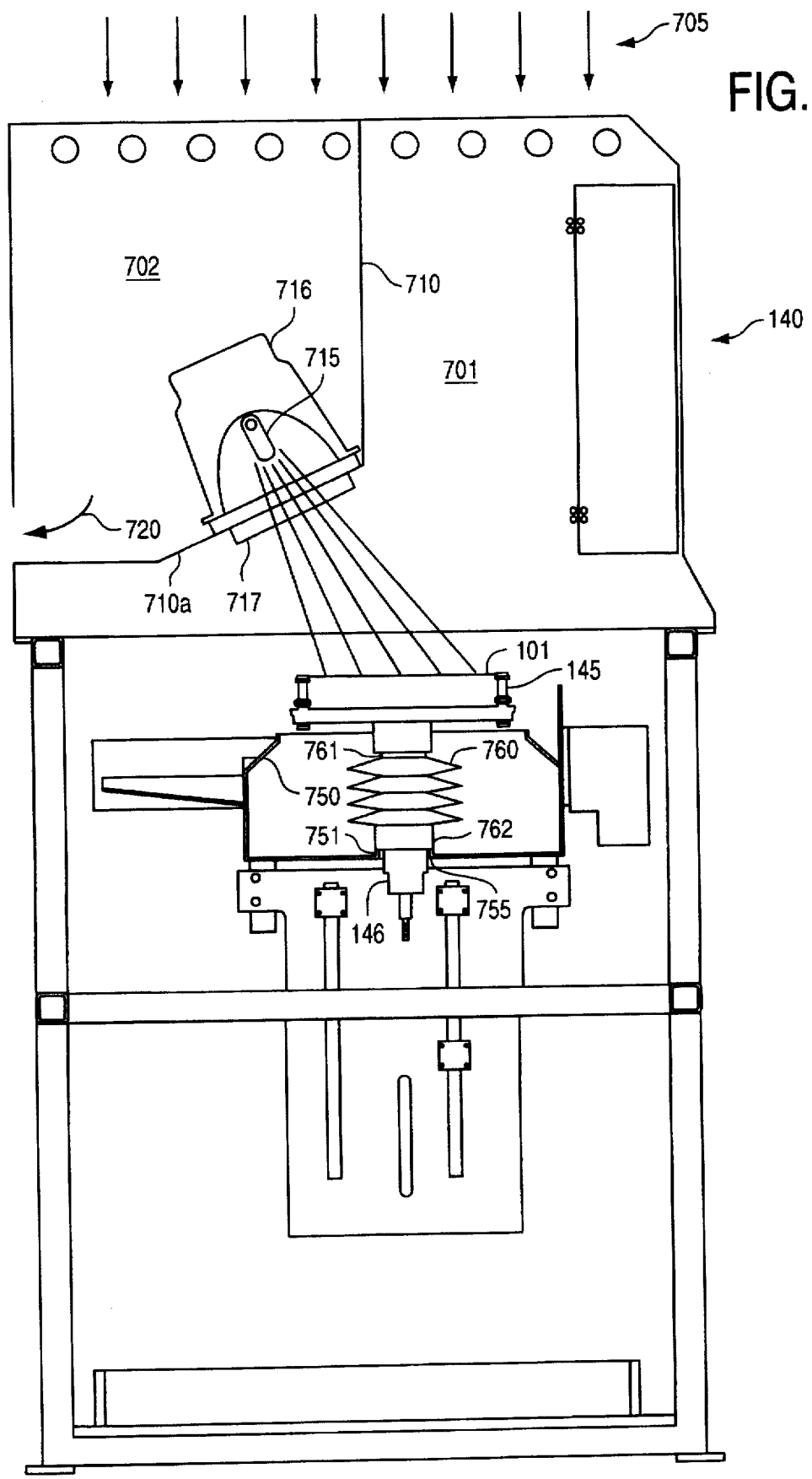
FIG. 7 shows a cross-sectional view of a spin dry station in a currently preferred embodiment of the present invention.

FIG. 7 shows an end view of and spin dry station 140. As shown, laminar airflow shown by arrows 705 flows into the entire enclosure 140. Also as shown, divider 710 separates portions 701 and 702. Portion 701 comprises spindle wafer holder 145 which holds the wafer during spin rinsing and drying. For clarity, other components, such as the spray nozzles, transport mechanisms, etc., are not shown in FIG. 7. Section 702 comprises lamp 715 including housing 716 as well as any associated wiring, bracketing, etc. Divider 710 comprises an opening over which quartz lens 717, which can withstand the heat of the lamp 715, is disposed in such a manner so as to seal the compartments 701 and 702 from one another, but allow the radiative heat from lamp 715 through to dry the wafer. By virtue of the separation of lamp 715 in portion 702 from the wafer processing apparatus in portion 701, the prior art problem of particulate contamination due to particulate generation from the heating of the lamp and wiring, as carried by the laminar flow, is avoided. As shown by arrow 720, exhaust flows out through an opening in the side of portion 702. The provision of airflow 705 from above and exhaust through 720 provides cooling for the heating lamp. In portion 701 an exhaust is drawn so that water particles are drawn downward and not redeposited on the drying wafer. It will be appreciated that many modifications in the embodiment shown in FIG. 7 may be made. For example, just the portion of the divider 710a, i.e. shield 710a, between the substrate holder and the lamp may be provided to shield the substrate holder from the lamp. However, the complete separation provided by the full divider 710 minimizes any intermixing of air which has contacted the lamp and its associated structure, with air which contacts the substrate processing apparatus. As a further alternative, the lamp may simply be offset from the wafer, i.e. not directly above the wafer as is done in the prior art. Again, while this embodiment provides some improvement over the prior art, it may not reduce particle levels to that achieved with the divider 710. As a further alternative, the shielded portion may be directly above the wafer if desired. The configuration shown in FIG. 7, with the lamp 715 off to the side of the substrate holder 145 has the advantage that the laminar flow over the wafer substrate processing apparatus is not disturbed so that a flow of clean laminar air, uncontaminated by the lamp and associated structures, may continually purge the area of contamination.

Spin dry station 140 also comprises cup 750 in a currently preferred embodiment. During spin rinsing and drying, spindle 146, and attached spindle wafer holder 145 are lowered such that the spindle wafer holder 145 with wafer 101 is below the top of cup 750. As described previously, an exhaust is pulled on cup 750 so that the water particles are directed downward and not redeposited on the wafer. The exhaust port is not shown in the view of FIG. 7. As shown, spindle 146 extends through an opening in cup 750 surrounded by collar 751. In the prior art, one problem which occurred is that water would seep through the gap 755 between the collar 751 and spindle 146, into the working parts of the machine. A further problem that occurs in the prior art is that the above described exhaust pulled on the cup 750 would cause air to be drawn up from the working parts of the machine into the cup 750. It will be appreciated that this air may have extremely high levels of contamination. In the present invention, this is overcome by use of bellows 760. Bellows 760 comprises an O-ring 761 molded into the top of bellows 760 which fits within a matching groove in the housing of spindle 146. The housing where the O-ring 761 is placed does not rotate during the spinning operation. Portion 762 of bellows 760 fits snugly around collar 751. In addition, this portion is firmly held in place with, for example, a wire tie. As can be seen from the Figure, bellows 760 effectively seals off the interface between the spindle 146 and associated machinery, and cup 750. In a currently preferred embodiment, bellows 760 is made of clear polyurethane. The bellows 760 is therefore flexible so that it can extend in accordion fashion to allow for the up and down motion of spindle 146 and wafer holder 145, while maintaining a seal.

Figure 8:
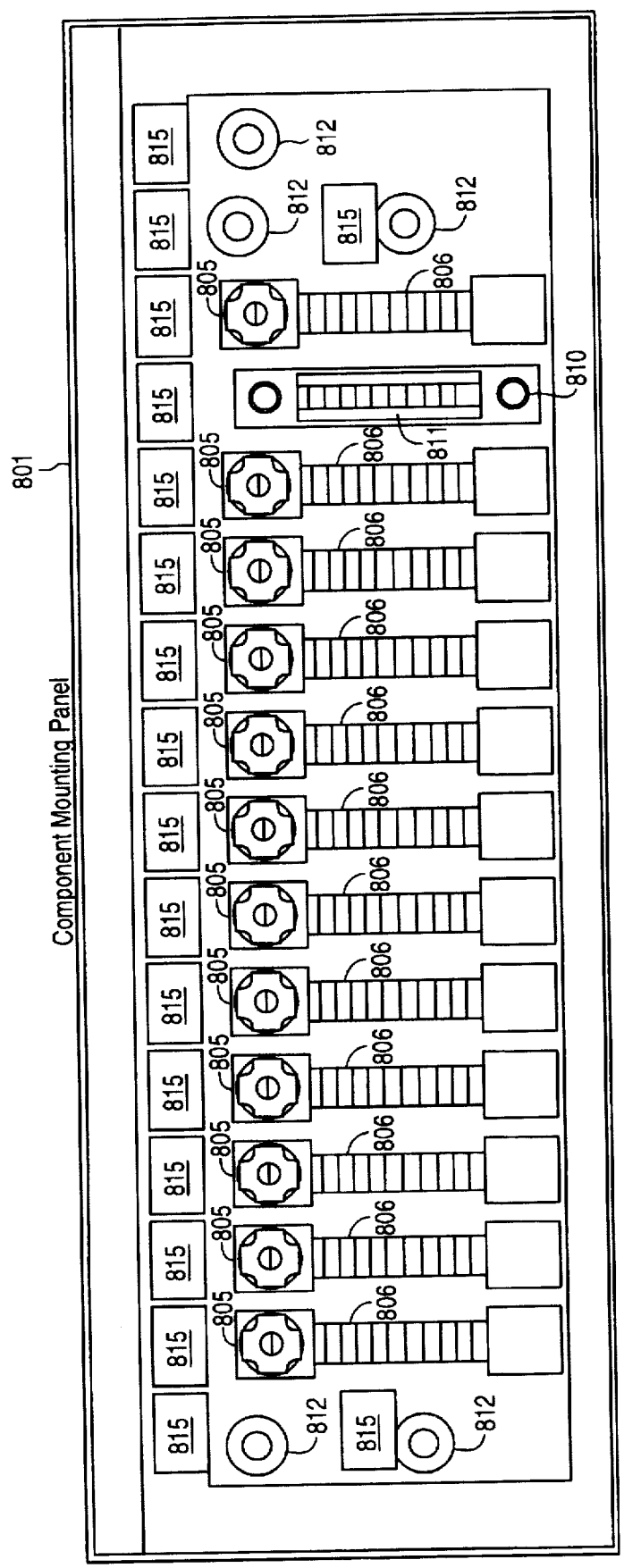
FIG. 8 shows a component mounting panel in a currently preferred embodiment of the present invention.

FIG. 8 illustrates a portion of component mounting panel 801 which is also shown in outline form in FIG. 1B. As shown, several fluid controllers 805 and flow meters 806 are disposed on an outer portion of the panel so that the flow of fluid may be controlled and monitored from the outside of the machine. As shown, in a currently preferred embodiment, a single device having both a flow controller 805 and meter 806 is used. Also as shown, the panel 801 comprises a nitrogen ($N_2$), flow controller 810 and meter 811, which is also a single unit in a currently preferred embodiment. Flow controllers 812 are used to regulate the flow of D.I. water and comprise a needle valve. The flow controllers 812 are used where the regulation of the fluid, such as D.I. water in certain cases, need not be precisely monitored and controlled. The various controllers and meters are mounted such that each has an input and an output extending through the panel 801 to the internal portion of the system. The input is coupled to an input line which supplies the appropriate chemical, while the output is coupled to an output line which extends to the appropriate nozzle in the appropriate module. The input line may come from a tank, or may come from a delivery line running through the fabrication area. It will be appreciated that as many fluid flow controllers 805 and meters 806, controllers 810 and meters 811 for nitrogen or other gas if needed, and controllers 812 may be provided as is necessary.

Additionally, any number of other types of controllers for fluids, air, nitrogen, vacuum, etc., may be provided on the panel 801.

As shown generally by 815, each meter and/or controller has nearby a label which describes what the controller is controlling and, if present, what the meter is measuring. It will be appreciated that due to the great number of lines, it is often difficult to correctly hook-up the appropriate meter and connection. In the prior art, it is necessary to identify a line, hold on to the line or flag it in some way, from the inside of the machine, and then look outside the machine, read the label, locate the relative position of the connection, and go back inside to hook-up the meter to the appropriate connection. In the present invention, the panel 801 is made of a substantially transparent material, for example, polycarbonate. Therefore, connection can be made by reaching behind panel 801 while watching which lines are connected to which meters. As is readily apparent, this greatly simplifies the task of connecting all lines to their appropriate meters and significantly reduces the chance of erroneous connections. In the prior art, an incorrect connection may cause many thousands of dollars of damage due to a number of wafers being processed before the error is found and corrected.

As described in the Background section, the presence of fluid in an environment may cause difficulties in sensing the presence of the wafer. This problem is particularly severe in load station 110 where the wafer must be detected from below, so that the of through-beam optical sensors used in the brush boxes cannot be used. In the present invention, it has been found that certain sensors, such as capacitive sensors, seldom, if ever, fail to detect a wafer which is actually present. Rather, the type of failure which is far more common is a false positive, i.e., detecting a wafer when there is no wafer present. This is due to the fact that the sensor works by detecting an increase in capacitance due to the presence of a material a certain distance from the sensor. Therefore, if a drop of water accumulates on the surface or around the casing of the sensor, the capacitance may increase sufficiently to cause the false positive reading. Therefore, in a currently preferred embodiment of the present invention this problem is overcome by using two such sensors. In one embodiment, two unshielded DC switching sensors of size M12, having a nominal detecting distance of 4 mm, part number E2K-X4ME1, available from Omron, are used in a logical AND configuration to detect the presence of a wafer. That is, in the present invention, both sensors must detect the presence of a wafer for the system to consider a wafer to be present. The two sensors are mounted directly underneath the transport mechanism 118 at the approximate nominal detecting distance such that both will detect the presence of the wafer when it is at a position to be sent by transport mechanism 118. In general, the precise placement of the two sensors is not critical, as the size of the sensors is such that physical limitations will require that their spacing be far greater than any single drop of water. It may be desirable to experiment with the placement of the sensors, because some regions may have a smaller probability of collecting a drop of water than other regions. As described earlier, the false positive failure occurs only a small percentage of the time. Although it is only a small percentage, the false positive causes a significant interruption in processing due to the great numbers of wafers processed. However, with the use of two sensors, the percentage is essentially squared. For example, if the failure typically occurs 0.1% of the time in a single sensor, the failure with two sensors occurs approximately 0.0001% of the time. An advantage of the present invention is that increased reliability is achieved at minimal cost, as capacitive sensors are relatively inexpensive.

Figure 9:
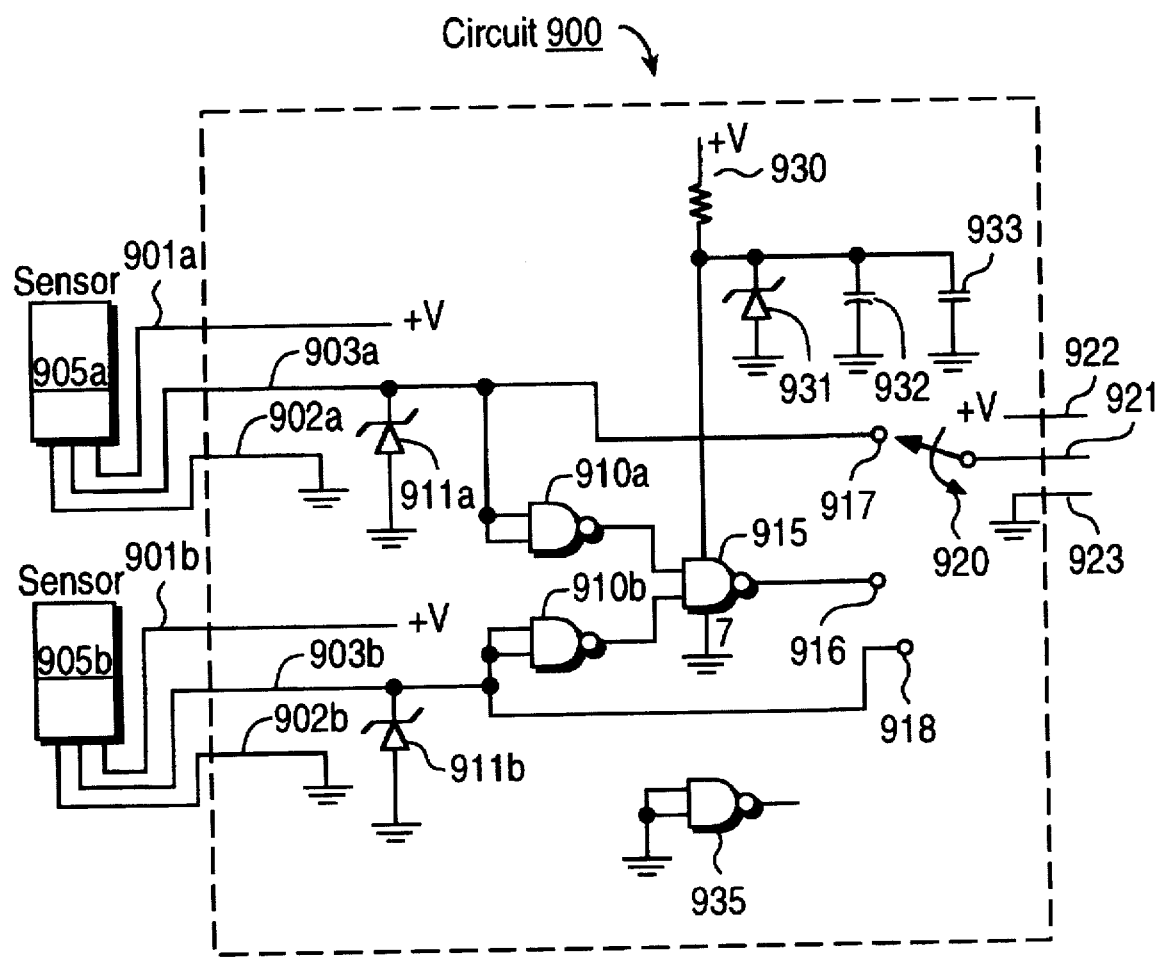
FIG. 9 shows a circuit diagram for a wafer sensor in a load station in a currently preferred embodiment of the present invention.

FIG. 9 illustrates circuit 900 which is used to implement two sensors to detect the wafer. The circuit shown is implemented using a 74HC00 chip. This chip may be added to a system having one sensor to retrofit it to have the improvement of the present invention. Lines 901a and 901b supply a positive voltage to first sensor 905a and second sensor 905b respectively. Lines 902a and 902b are ground lines. Signal lines 903a and 903b from sensors 905a and 905b are coupled to NAND gates 910a and 910b, respectively, in an inverter configuration, as shown. Additionally, each of the lines is coupled to ground through zener diodes 911a and 911b respectively. In a currently preferred embodiment, zener diodes part number 1N751A are utilized. These diodes are utilized to rectify the input voltage to approximately +5 V for the 74HC00 logic chip to operate. As shown, the output of inverters 910a and 910b are coupled to NAND gate 915. Switch 920 may be coupled to the output 916 of NAND gate 915 or, as shown may be coupled to output 917 of sensor 905a alone or the output 918 of sensor 905b alone. In this way, the user may use either sensor 905a alone or 905b alone (for example, during calibration) or may use the output of NAND gate 915 which detects a wafer only when both of sensors 905a and 905b detect a wafer. It will be appreciated that in the embodiment shown, the above described sensors send a high signal when no wafer is present and a low signal when the wafer is present. Therefore, for example, if a wafer is present, both sensors 905a and 905b send a low signal. Both low signals are inverted in NAND gates 910a and 910b, respectively, to high signals. The high signals from the inverter result in a low signal out of NAND gate 915. Therefore, the system sees the same signal as if a single sensor had sensed the presence of a wafer and sent a low signal. Switch 920 is coupled to the system via line 921. Additionally, line 922 couples a positive voltage to the system and line 923 couples the system to ground. Also as shown, NAND gate 915 is coupled to a positive voltage via line 930. Line 930 is coupled to ground, in parallel through zener diode 931, capacitor 932 and capacitor 933. In a currently preferred embodiment, zener diode part number 1N751A is utilized for diode 931. Capacitor 932 has a capacitance of approximately 10 µF and capacitor 933 has a capacitance of approximately 0.1 µF. Also as shown in FIG. 9, NAND gate 935 is not connected. It will appreciated that many equivalent circuits may be used to accomplish the functions described above. The exact configuration will depend upon the sensors used, requirements of the system, etc. As described above, by requiring that both sensors sense a wafer, significant increase in reliability is achieved. Further, because it has been discovered that the characteristics of some type of sensors such as the capacitive sensor is such that the sensor does not have a significant error rate of false negatives, there is little risk of failing to sense a wafer which is present. As mentioned, there is a mathematical possibility that both may, for example, have a water drop thereon thus causing both to have a false positive a very small percentage at a time. The possibility of a false positive can be made even more remote by requiring that both agree over a short period of time. For example, in one embodiment the system is programmed to require that the output 916 shows the presence of a wafer (i.e., low in the circuit shown) three times over a period of approximately 10–100 milliseconds. Again, it will appreciated that numerous similar routines may be utilized.

In addition to the above-described embodiment, which may be used to retrofit old systems, as well as in new systems, in a further embodiment of the present invention the same function may be performed by the hardware and/or software of the computer system 170. In such an embodiment, the outputs 903a and 903b of sensors 905a and 905b, respectively, are coupled directly to computer system 170, which can perform the above-described AND function using well known methods. An advantage of such an arrangement is that a history of readings may be kept. In this way, an early warning may be given, if for example, one of the sensors 905a or 905b regularly fails by having, for example, false positive readings. A false positive can be inferred when one sensor detects a wafer when the other does not, since it is far less likely the non-detecting sensor is in error. By compiling a record of readings in this way, if one sensor begins to have an increase in the number of false positives compared with the other, the system may alert the operator to the situation so that the sensor can be replaced and/or other problem causing the error can be corrected. This warning is advantageous, because without such an early warning, as a sensor fails, the failure mode of falsely detecting a wafer would gradually creep up to the single sensor situation. For example, if a typical rate is the 0.1% false positive described above, the system may flag the operator that there is a problem when one of the sensors reaches a false positive error rate of, for example, 1%. At this stage, the combined error rate of the failing sensor and non-failing sensor is still significantly lower than the single sensor situation.

As mentioned in the background section, the portion of the system having the brush stations 120 and 130 is often considered the "dirty" side of the system while the output station 150 is considered the clean portion. It will be appreciated that although airflow above the system may be laminar, as desired, airflow in some parts of the system, including within the processing apparatus and working machinery, may become turbulent, may have eddy currents, may have diffusion effects, etc., and in general may be unpredictable. Thus, air present in the dirty side may flow to the clean side, generally increasing the level of contamination therein. Referring again to FIG. 1B, in the present invention this problem is preventing by airflow control bulkhead 190 between spin dry station 140 and output station 150. In the back section 191 of the system 100, shown in FIG. 1C, louvers 192a and 192b are disposed on the clean side 196 and the dirty side 195 of the system, respectively. The louvers 192a and 192b are disposed generally along the entire length of the system. The louvers allow air to flow out of the system. In this way, laminar airflow which flows in from above the modules, flows out the back of the same side of the machine. With the bulkhead 190 present between the two sides, there is reduced possibility of intermixing of air from the dirty side to the clean side, thereby reducing particulate levels in the clean side. If desired, the bulkhead may be placed between the scrub station 130 and spin dry station 140, as the spin dry station 140 is cleaner than the scrub stations. Alternatively, more than one bulkhead may be used, e.g., the bulkhead 190 plus an additional bulkhead between scrub station 130 and spin dry station 140. Thus, an improved wafer processing system has been described. Although specific embodiments, including specific equipment, configurations, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A spin drying station for drying a substrate comprising:
   a substrate holder, said substrate holder receiving a substrate from a wet processing station, said substrate holder capable of spinning said substrate;
   a heat lamp disposed to heat said substrate disposed in said substrate holder, wherein said substrate holder and said heat lamp operate to dry said substrate; and
   a shield disposed between said substrate holder and said heat lamp in order to reduce contamination from said heat lamp;
   wherein said heat lamp is disposed in a first compartment and said substrate holder is disposed in a second compartment, said station comprising a divider between said first and said second compartment.

2. The spin drying station as described in claim 1 wherein said heat lamp is disposed above and to the side of said substrate holder.

3. The spin drying station as described in claim 1 further comprising laminar air flow apparatus disposed above said first and said second compartments, said first and said second compartments each having an opening to admit said laminar air flow in order to prevent intermixing of the airflow between said first and second compartments.

4. The spin drying station as described in claim 1 wherein said substrate is a semiconductor substrate.

5. A processing system comprising:
   a first processing module, said first processing module having a first upper section comprising a wet processing apparatus;
   a second processing module, said second processing module having a second upper section comprising second processing apparatus, said second processing module having a lower contamination level than said first processing module;
   a third processing module disposed between said first processing module and said second processing module, said third processing module having a third upper section comprising a spin dry station;
   a first air outlet in a first lower section of said first processing module and a second air outlet in a second lower section of said second processing module; and
   a divider between said first processing module and said second processing module, said divider disposed between said first lower section of said first processing module and said second lower section of said second processing module in order to prevent intermixing of the airflow between said modules thus decreasing the contamination levels in said modules.

6. The processing system as described in claim 5 wherein said wet processing apparatus comprises a scrub station and said second processing apparatus comprises an output station.

7. The processing system as described in claim 5 wherein said divider is disposed between a third lower section of said third processing module and said second lower section of said second processing module.

8. The processing system as described in claim 7 wherein said wet processing apparatus comprises a scrub station, said second processing apparatus comprises an output station, and said third processing apparatus comprises a spin dry station.

9. The processing system as described in claim 7 further comprising a second divider disposed between said first lower section of said first processing module and said third lower section of said third processing module.

10. The processing system as described in claim 8 further comprising a second divider disposed between said first lower section of said first processing module and said third lower section of said third processing module.

11. The spin drying station described in claim 8 further comprising a laminar air flow apparatus disposed above said spin drying station.

12. A processing system as described in claim 5 wherein said substrate is a semiconductor substrate.

13. A spin drying station for spin drying a substrate comprising:
    a substrate holder, said substrate holder receiving a substrate from a wet processing station, said substrate holder capable of spinning said substrate;
    a heat lamp disposed to heat a substrate disposed in said substrate holder, wherein said substrate holder and said heat lamp operate to dry said substrate; and
    a shield disposed between said substrate holder and said heat lamp in order to reduce contamination from said heat lamp;
    wherein said heat lamp is disposed in a first compartment and said substrate holder is disposed in a second compartment, said station comprising a divider between said first and said second compartment, said drying station further comprising laminar air flow apparatus disposed above said first and second compartments, said first and said second compartment each having an opening to admit said laminar air flow in order to prevent intermixing of the airflow between said first and second compartments.

14. The spin drying station as described in claim 13 wherein said first compartment comprises an exhaust opening separate from said second compartment.

15. The spin drying station as described in claim 14 wherein said heat lamp is disposed above and to the side of said substrate holder.

16. The spin drying station as described in claim 15 wherein said heat lamp is disposed above and to the side of said substrate holder.

17. The spin drying station as described in claim 13 wherein said substrate is a semiconductor substrate.

* * * * *